United States Patent
Du et al.

(10) Patent No.: US 11,721,291 B2
(45) Date of Patent: Aug. 8, 2023

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Hongjun Zhou, Beijing (CN); Bo Wei, Beijing (CN); Qian Ma, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 95 days.

(21) Appl. No.: 17/418,258

(22) PCT Filed: Sep. 18, 2020

(86) PCT No.: PCT/CN2020/116162
§ 371 (c)(1),
(2) Date: Jun. 25, 2021

(87) PCT Pub. No.: WO2022/056829
PCT Pub. Date: Mar. 24, 2022

(65) Prior Publication Data
US 2022/0319437 A1    Oct. 6, 2022

(51) Int. Cl.
*G09G 3/3275* (2016.01)
(52) U.S. Cl.
CPC ... *G09G 3/3275* (2013.01); *G09G 2300/0426* (2013.01); *G09G 2330/02* (2013.01); *G09G 2330/04* (2013.01); *G09G 2330/12* (2013.01)

(58) Field of Classification Search
CPC .............. H01L 27/326; H01L 27/3218; H01L 27/3244; G02F 2201/56; G02F 1/13454
See application file for complete search history.

(56) References Cited

U.S. PATENT DOCUMENTS

| | | |
|---|---|---|
| 2016/0027380 A1 | 1/2016 | Kim et al. |
| 2016/0139706 A1 | 5/2016 | Lee et al. |

(Continued)

FOREIGN PATENT DOCUMENTS

| | | |
|---|---|---|
| CN | 107039008 A | 8/2017 |
| CN | 107393472 A | 11/2017 |

(Continued)

*Primary Examiner* — Nitin Patel
*Assistant Examiner* — Amen W Bogale
(74) *Attorney, Agent, or Firm* — Ling Wu; Stephen Yang; Ling and Yang Intellectual Property

(57) ABSTRACT

Provided are a display substrate and a display apparatus. The display substrate includes a display region and a non-display region surrounding the display region. The display region includes at least an arc-shaped display boundary; the display region includes multiple sub-pixels, multiple data lines extending along a first direction and multiple gate lines extending along a second direction; each sub-pixel includes a pixel circuit and a light emitting element connected to the pixel circuit, the pixel circuit in each sub-pixel is electrically connected to a gate line and a data line respectively; at least part of sub-pixels near the arc-shaped display boundary are disposed in a terraced manner. The non-display region includes multiple cascaded drive circuits which provide drive signals to the multiple gate lines, at least part of drive circuits near the arc-shaped display boundary are disposed in a terraced manner, the first direction intersects with the second direction.

19 Claims, 25 Drawing Sheets

(56) References Cited

U.S. PATENT DOCUMENTS

| | | |
|---|---|---|
| 2017/0219895 A1 | 8/2017 | Yu et al. |
| 2017/0338295 A1 | 11/2017 | Lee et al. |
| 2018/0006105 A1* | 1/2018 | Kim .................... G09G 3/3258 |
| 2019/0164996 A1 | 5/2019 | Wang et al. |
| 2019/0197962 A1 | 6/2019 | Moon et al. |

FOREIGN PATENT DOCUMENTS

| | | |
|---|---|---|
| CN | 107833895 A | 3/2018 |
| CN | 107887421 A | 4/2018 |
| CN | 107991799 A | 5/2018 |
| CN | 108445686 A | 8/2018 |
| CN | 109243364 A | 1/2019 |
| CN | 109979397 A | 7/2019 |
| CN | 110297342 A | 10/2019 |
| CN | 110867472 A | 3/2020 |
| CN | 111445862 A | 7/2020 |
| KR | 10-2017-0038346 A | 4/2017 |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2020/116162 having an international filing date of Sep. 18, 2020 and entitled "Display Substrate and Display Apparatus", the contents of which should be construed as being hereby incorporated by reference.

TECHNICAL FIELD

The present disclosure relates to, but is not limited to, the field of display, in particular to a display substrate and a display apparatus.

BACKGROUND

At present, Organic Light Emitting Diode (abbreviated as OLED) is one of the hot spots in the field of display research. Compared with Liquid Crystal Display (abbreviated as LCD), the organic light emitting diode (OLED) has advantages of low energy consumption, low production cost, self-luminescence, wide viewing angle, fast response speed, and so on, and has been widely used in display fields such as mobile phones, tablet computers and digital cameras.

With the continuous development of display technology, a great "screen-to-body ratio (that is, a ratio of an actual area of the display region to a total area of the display side)" has become one of the appearance characteristics sought by display apparatuses. Especially for wearable display apparatuses (such as smart watches), based on considerations on aspects of portability and viewing angle effect, extremely narrow bezel and even full screen display have become an important development trend.

SUMMARY

The following is a summary of the subject matter described in detail in the present disclosure. This summary is not intended to limit the protection scope of the claims.

In a first aspect, the disclosure further provides a display substrate, which includes a display region and a non-display region surrounding the display region, wherein the display region includes at least one arc-shaped display boundary;

The display region includes multiple sub-pixels, multiple data lines extending along a first direction and multiple gate lines extending along a second direction, each sub-pixel includes a pixel circuit and a light emitting element connected to the pixel circuit, wherein the pixel circuit in each sub-pixel is electrically connected to a gate line and a data line respectively, and at least part of the sub-pixels near an arc-shaped display boundary are disposed in a terraced manner;

the non-display region includes multiple drive circuits which are cascaded and provide drive signals to multiple gate lines, and at least part of the drive circuits near the arc-shaped display boundary are disposed in a terraced manner;

wherein the first direction intersects with the second direction.

In some possible implementations, the display region further includes multiple first power lines extending along the first direction and multiple initial signal lines extending along the second direction, and the pixel circuit in each sub-pixel is electrically connected to a first power line and an initial signal line respectively;

the non-display region further comprises a first power supply line and an initial signal supply line, and the first power supply line and the initial signal supply line are in an annular shape;

the first power supply line is located on a side of multiple drive circuits close to the display region, and is electrically connected to the first power line connected to each pixel circuit, and a first power supply line near the arc-shaped display boundary is in a terraced shape; and the initial signal supply line is located between the multiple drive circuits and the first power supply line, and is electrically connected to the initial signal line connected to each pixel circuit, and the initial signal supply line near the arc-shaped display boundary is in a terraced shape.

In some possible implementations, a line width of the first power supply line is greater than a line width of the initial signal supply line.

In some possible implementations, the display region further includes a second power line, and a light emitting element in each sub-pixel is electrically connected to the second power line;

the non-display region further includes a second power supply line; wherein the second power supply line is in an annular shape;

the second power supply line is located on a side of the multiple drive circuits away from the display region, and is electrically connected to the second power line connected to each light emitting element, a surface of the second power supply line near the arc-shaped display boundary near the display region is in a terraced shape, and a surface of the second power supply line near the arc-shaped display boundary away from the display region is arc-shaped.

In some possible implementations, a line width of the second power supply line is greater than the line width of the first power supply line.

In some possible implementations, the display region further includes multiple light emission control lines and reset control lines extending along the second direction, the pixel circuit in each sub-pixel is electrically connected to a light emission control line and a reset control line;

the non-display region includes multiple control circuits which are cascaded and provide control signals to the multiple light emission control lines, and at least part of the control circuits near the arc-shaped display boundary are disposed in a terraced manner; and the multiple drive circuits and the multiple control circuits are respectively located on a first side and a second side of the display region which are oppositely disposed.

In some possible implementations, the non-display region further includes multiple multiplexing circuits located between the multiple drive circuits and the initial signal supply line, electrically connected to multiple data lines, and configured to provide data signals to the data lines connected thereto;

wherein at least part of the multiplexing circuits near the arc-shaped display boundary are disposed in a terraced manner.

In some possible implementations, the non-display region further includes multiple multiplexing control lines and multiple multiplexing data lines, and each multiplexing circuit is electrically connected to the multiple multiplexing control lines and one multiplexing data line respectively;

multiple multiplexing control lines are located between multiple drive circuits and the multiple multiplexing circuits, multiple multiplexing control lines near the arc-shaped display boundary are in a terraced shape.

In some possible implementations, the non-display region further includes multiple electrostatic discharge circuits, each of the electrostatic discharge circuits is connected to one signal line and is configured to discharge static electricity in the signal line connected thereto, and the signal line includes a multiplexing data line; and the multiple electrostatic discharge circuits are located between the multiple drive circuits and the second power supply line, and at least part of the electrostatic discharge circuits near the arc-shaped display boundary are disposed in a terraced manner.

In some possible implementations, the non-display region further includes a test control line and multiple test circuits, and the test circuits are electrically connected to the test control line and the data lines respectively, and are configured to provide test signals to the data lines;

the multiple test circuits are located on a third side of the display region, and the third side is different from the first side and the second side;

the test control line is located between the second power supply line and the multiple electrostatic discharge circuits, and the test control line near the arc-shaped display boundary is in a terraced shape.

In some possible implementations, the non-display region further includes a third power line and a fourth power line, each drive circuit is electrically connected to the third power line and the fourth power line respectively, and the third power line and the fourth power line are in an annular shape;

the third power line is located between the electrostatic discharge circuit and the multiple drive circuits, and a third power line near the arc-shaped display boundary is in a terraced shape; and the fourth power line is located between the third power line and the multiple drive circuits, and the fourth power line near the arc-shaped display boundary is in a terraced shape.

In some possible implementations, the non-display region further includes a first clock signal line, a second clock signal line, a signal input line and a signal output line, and each drive circuit is electrically connected to the first clock signal line, the second clock signal line, the signal input line and the signal output line respectively;

the first clock signal line is located between the third power line and the multiple drive circuits, and the first clock signal line near the arc-shaped display boundary is in a terraced shape;

the second clock signal line is located between the third power line and the first clock signal line, and the second clock signal line near the arc-shaped display boundary is in a terraced shape; and the signal input line and the signal output line are located on a side of the drive circuit close to the display region.

In some possible implementations, the non-display region further includes multiple multiplexing connection electrodes and multiple initial connection electrodes;

the multiplexing connection electrodes are electrically connected to the multiplexing circuit and the data line respectively, the initial connection electrodes are electrically connected to an initial signal line and an initial signal supply line respectively;

wherein the multiple multiplexing connection electrodes and the multiple initial connection electrodes are disposed in a same layer, the initial connection electrodes are disposed in a same layer as the initial signal lines, and the multiplexing connection electrodes are disposed in a different layer from the data lines.

In some possible implementations, the non-display region further includes a gate line connection electrode and a reset connection electrode;

the gate line connection electrode is electrically connected to the gate line and the signal output line respectively; and the reset connection electrode is electrically connected to the reset signal line and the signal input line respectively;

wherein the gate line connection electrode and the reset connection electrode are disposed in the a layer and are disposed in a same layer as the gate line.

In some possible implementations, the non-display region further includes an encapsulation electrode;

the encapsulation electrode is located on a side of the second power supply line away from the display region, and the encapsulation electrode is disposed in a different layer from the second power supply line and is electrically connected to the second power supply line; and the encapsulation electrode is provided with multiple via holes.

In some possible implementations, the display substrate further includes a multiplexing circuit, an electrostatic discharge circuit, a test circuit and a control circuit located in the non-display region, wherein the pixel circuit includes multiple pixel transistors, the drive circuit includes multiple shift transistors, the multiplexing circuit includes multiple multiplexing transistors, the electrostatic discharge circuit includes multiple discharge transistors, the test circuit includes multiple test transistors, and the control circuit includes multiple control transistors;

the display substrate includes a base substrate and an active layer, a first insulating layer, a first metal layer, a second insulating layer, a second metal layer, a third insulating layer and a third metal layer which are sequentially stacked on the base substrate;

the active layer includes active layers of multiple pixel transistors, active layers of multiple shift transistors, active layers of multiple multiplexing transistors, active layers of multiple discharge transistors, active layers of multiple test transistors and active layers of multiple control transistors. The first metal layer includes control electrodes of the multiple pixel transistors, control electrodes of the multiple shift transistors, control electrodes of the multiple multiplexing transistors, control electrodes of the multiple test transistors, control electrodes of the multiple discharge transistors, control electrodes of the multiple control transistors, a multiplexing data line, a light emission control line, a gate line, a reset signal line, a gate line connection electrode, a reset connection electrode and an encapsulation electrode. The second metal layer includes an initial signal line, a multiplexing connection electrode and an initial connection electrode. The third metal layer includes first electrodes and second electrodes of the multiple pixel transistors, first electrodes and second electrodes of the multiple shift transistors, first electrodes and second electrodes of the multiple multiplex transistors, first electrodes and second electrodes of the multiple test transistors, first electrodes and second electrodes of the multiple discharge transistors, first electrodes and second electrodes of the multiple control transistors, a data line, a first power line, a first power supply line, an initial signal supply line, a multiplexing control line, a third power line, a fourth power line, a first clock signal line, a second clock signal line, a test control line, and a second power supply line.

In some possible implementations, the third insulating layer is provided with via holes exposing the multiplexing connection electrode and via holes exposing the initial connection electrode, the second insulating layer and the third insulating layer are provided with via holes exposing the gate line connection electrode and via holes exposing the reset connection electrode;

the data line is electrically connected to the multiplexing connection electrode through the via holes exposing the multiplexing connection electrode, and the initial signal supply line is electrically connected to the initial signal line through the via holes exposing the initial connection electrode; and the signal output line is electrically connected to the gate line connection electrode through the via holes exposing the gate line connection electrode, and the signal input line is electrically connected to the reset connection electrode through the via holes exposing the reset connection electrode.

In some possible implementations, an orthographic projection of the second power supply line on the base substrate at least partially overlaps with an orthographic projection of the encapsulation electrode on the base substrate;

the second insulating layer and the third insulating layer are provided with via holes exposing the encapsulation electrodes, the second power supply line is electrically connected to the encapsulation electrode through the via holes exposing the encapsulation electrode; and the second insulating layer and the third insulating layer are provided with multiple via hole arrays, and an orthographic projection of the via holes disposed on the encapsulation electrode on the base substrate covers an orthographic projection of the via hole arrays on the base substrate.

In some possible implementations, multiple sub-pixels disposed along the second direction are called a row of sub-pixels, and a length of each row of sub-pixels along the first direction is 74 microns to 75 microns;

a length along the first direction of each step of terraced signal lines near the arc-shaped display boundary is an integral multiple of the length of each row of sub-pixels along the first direction; and the signal lines include a first power supply line, an initial signal supply line, a multiplexing control line, a third power line, a fourth power line, a first clock signal line, a second clock signal line, a test control line and a second power supply line.

In a second aspect, the present disclosure further provides a display apparatus, including the above display substrate.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain the technical solutions of the present disclosure and do not constitute a limitation on the technical solutions of the present disclosure.

DETAILED DESCRIPTION

Figure 1A:
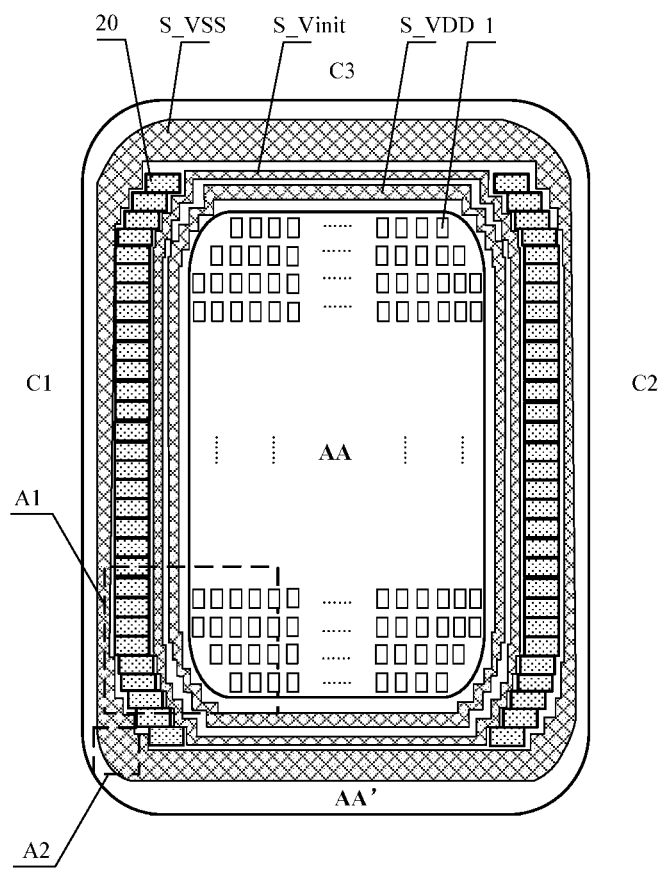
FIG. 1A is a schematic diagram of a structure of a display substrate according to an embodiment of the present disclosure.

Multiple embodiments are described in the present disclosure, but the description is exemplary rather than restrictive, and for those of ordinary skills in the art, there may be more embodiments and implementation solutions within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any regular features or elements to form a technical solution defined by the claims. Any feature or element of any embodiment may also be combined with features or elements from another technical solution to form another technical solution defined by the claims. Therefore, it should be understood that any of the features shown and/or discussed in the present disclosure may be implemented individually or in any suitable combination. Therefore, the embodiments are not otherwise limited except in accordance with the appended claims and equivalents thereof. In addition, various modifications and changes may be made within the protection scope of the appended claims.

Unless otherwise defined, technical terms or scientific terms used in the present disclosure shall have ordinary meanings understood by those of ordinary skills in the art to which the present disclosure belongs. The words "first", "second" and the like used in the present disclosure do not indicate any order, quantity or importance, but are only used to distinguish different components. The word "include" or "comprise" or the like means that element or article appearing before the word contains elements or articles listed after the word and their equivalents, without excluding other elements or articles. The word "connect" or "link" or the like is not limited to physical or mechanical connections, but may include electrical connections, whether the connection is direct or indirect. "Up", "down", "left", "right" and the like are only used to represent a relative position relation that may change accordingly when an absolute position of an object being described is changed.

In this specification, a transistor refers to an element including at least three terminals, namely a gate electrode, a drain electrode and a source electrode. The transistor has a channel region between the drain electrode (also referred to as a drain electrode terminal, a drain region or a drain electrode) and the source electrode (also referred to as a source electrode terminal, a source region or a source electrode), and current may flow through the drain electrode, the channel region and the source electrode. In this specification, a channel region refers to a region which current mainly flows through. A first electrode may be a drain electrode and a second electrode may be a source electrode, or the first electrode may be a source electrode and the second electrode may be a drain electrode. The function of the "source electrode" and that of the "drain electrode" are sometimes interchangeable under circumstances such as where transistors with opposite polarities are used or where the current direction changes during circuit operation. Therefore, in this specification, "source electrode" and "drain electrode" are interchangeable. In addition, there are two types of transistors: P-type transistor and N-type transistor, wherein the P-type transistor is turned on when its gate is at a low level and turned off when its gate is at a high level, and the N-type transistor is turned on when its gate is at a high level and turned off when its gate is at a low level.

In this specification, an "electrical connection" includes a case where constituent elements are connected together through an element having certain electrical action. The "element having certain electrical action" is not particularly limited as long as it may transmit and receive electrical signals between the connected constituent elements. Examples of the "elements having certain electrical action" include not only electrodes and wirings, but also switching elements such as transistors, resistors, inductors, capacitors, and other elements having various functions.

In this specification, "parallel" refers to a state in which two straight lines form an angle above −10 degrees and below 10 degrees, and thus also includes a state in which the angle is above −5 degrees and below 5 degrees. In addition, "perpendicular" refers to a state in which two straight lines form an angle above 80 degrees and below 100 degrees and thus, includes a state in which the angle is above 85 degrees and below 95 degrees.

In this specification, "film" and "layer" are interchangeable. For example, sometimes "conductive layer" may be replaced by "conductive film". Similarly, "insulating film" may sometimes be replaced by "insulating layer".

In the present disclosure, "about" means that there is no strict limit for a value, and values within a range of process and measurement errors are allowable.

In a display apparatus, a layout of part of signal lines and circuits makes it impossible for the display apparatus to realize a narrow bezel.

Figure 1B:
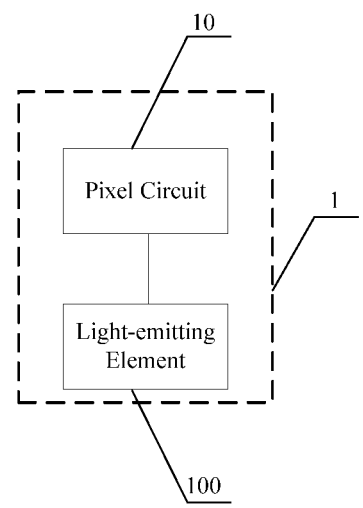
FIG. 1B is a schematic diagram of a structure of a sub-pixel.

FIG. 1A is a schematic diagram of a structure of a display substrate according to an embodiment of the present disclosure, and FIG. 1B is a schematic diagram of a structure of a sub-pixel. As shown in FIGS. 1A and 1B, the display substrate according to the embodiment of the present disclosure includes a display region AA and a non-display region AA' surrounding the display region, wherein the display region includes at least one arc-shaped display boundary.

The display region AA includes multiple sub-pixels 1, multiple data lines extending along a first direction and multiple gate lines (not shown in the figure) extending along a second direction. Each sub-pixel includes a pixel circuit 10 and a light emitting element 100 connected to the pixel circuit 10, and the pixel circuit in each sub-pixel is electrically connected to a gate line and a data line respectively, at least part of the sub-pixels near an arc-shaped display boundary are disposed in a terraced manner.

The non-display region AA' includes multiple drive circuits 20 that are cascaded and provide drive signals to the multiple gate lines. At least a part of the drive circuits near the arc-shaped display boundary are disposed in a terraced manner, wherein, the first direction intersects with the second direction.

In an exemplary embodiment, shape of the display region may be a rounded polygon or a circle. When the shape of the display region is a rounded polygon, the display region may further include a straight display boundary. FIG. 1 illustrates an example in which the display region is a rounded quadrilateral.

In an exemplary embodiment, when the shape of the display region is a rounded polygon, multiple drive circuits near the straight display boundary are disposed along the straight display boundary.

In an exemplary embodiment, the intersection of the first direction and the second direction means that an included angle between the first direction and the second direction is about 70 degrees to 90 degrees.

In an exemplary embodiment, the light emitting element may be an organic light emitting diode OLED, and in this case, the display substrate is an organic light emitting diode OLED display substrate.

In an exemplary embodiment, there are various representation forms of sub-pixels 1, as long as they can realize independent display. Different sub-pixels 1 may have various colors, so that color display may be realized by mixing light of different sub-pixels 1. When the color display is to be realized, multiple sub-pixels 1 with different colors may be disposed together to form a "pixel (or pixel unit)", that is, the light emitted by these sub-pixels 1 is mixed together to become a visual "point"; for example, three sub-pixels 1, which may be red, green and blue, form a pixel.

In an exemplary embodiment, each intersection of a data line and a gate line may define a sub-pixel 1, and the sub-pixel 1 at their intersection may perform display through common control of the gate line and the data line.

In an exemplary embodiment, sub-pixels in the display region may be disposed in an array, that is, the sub-pixels may be disposed in multiple rows and columns, wherein each row of sub-pixels is connected to one gate line, and each column of sub-pixels is connected to one data line. It should be understood that the sub-pixels are not necessarily disposed in an array and each data line and gate line are not necessarily connected to the sub-pixels in a same column or in a same row.

In an exemplary embodiment, the number of the drive circuits is the same as the number of rows of sub-pixels.

In an exemplary embodiment, at least part of drive circuits near an arc-shaped display boundary are disposed in a terraced manner according to a manner in which at least part of sub-pixels near the arc-shaped display boundary are disposed in a terraced manner, that is, a distance along a second direction between at least part of the drive circuits disposed in a terraced manner near the arc-shaped display boundary and at least part of the sub-pixels disposed in a terraced manner near the arc-shaped display boundary is smaller than a threshold distance.

In an exemplary embodiment, a terraced distribution may be 90-degree steps, or may be steps of other angles, determined by a layout of the display substrate.

In an exemplary embodiment, at least part of drive circuits near an arc-shaped display boundary may be disposed in a wavy shape.

A display substrate according to an embodiment of the disclosure includes a display region and a non-display region surrounding the display region, wherein the display region includes at least one arc-shaped display boundary. The display region includes multiple sub-pixels, multiple data lines extending along a first direction and multiple gate lines extending along a second direction. Each sub-pixel includes a pixel circuit and a light emitting element connected to the pixel circuit, wherein the pixel circuit in each sub-pixel is electrically connected to a gate line and a data line respectively. At least a part of sub-pixels near an arc-shaped display boundary are disposed in a terraced manner. The non-display region includes multiple drive circuits which are cascaded and provide drive signals to the multiple gate lines; at least part of the drive circuits near the arc-shaped display boundary are disposed in a terraced manner, wherein the first direction intersects with the second direction. According to the present disclosure, space occupied by the display apparatus may be reduced and a narrow bezel of the display apparatus may be realized by disposing at least part of the drive circuits near the arc-shaped display boundary in a terraced manner.

Figure 2:
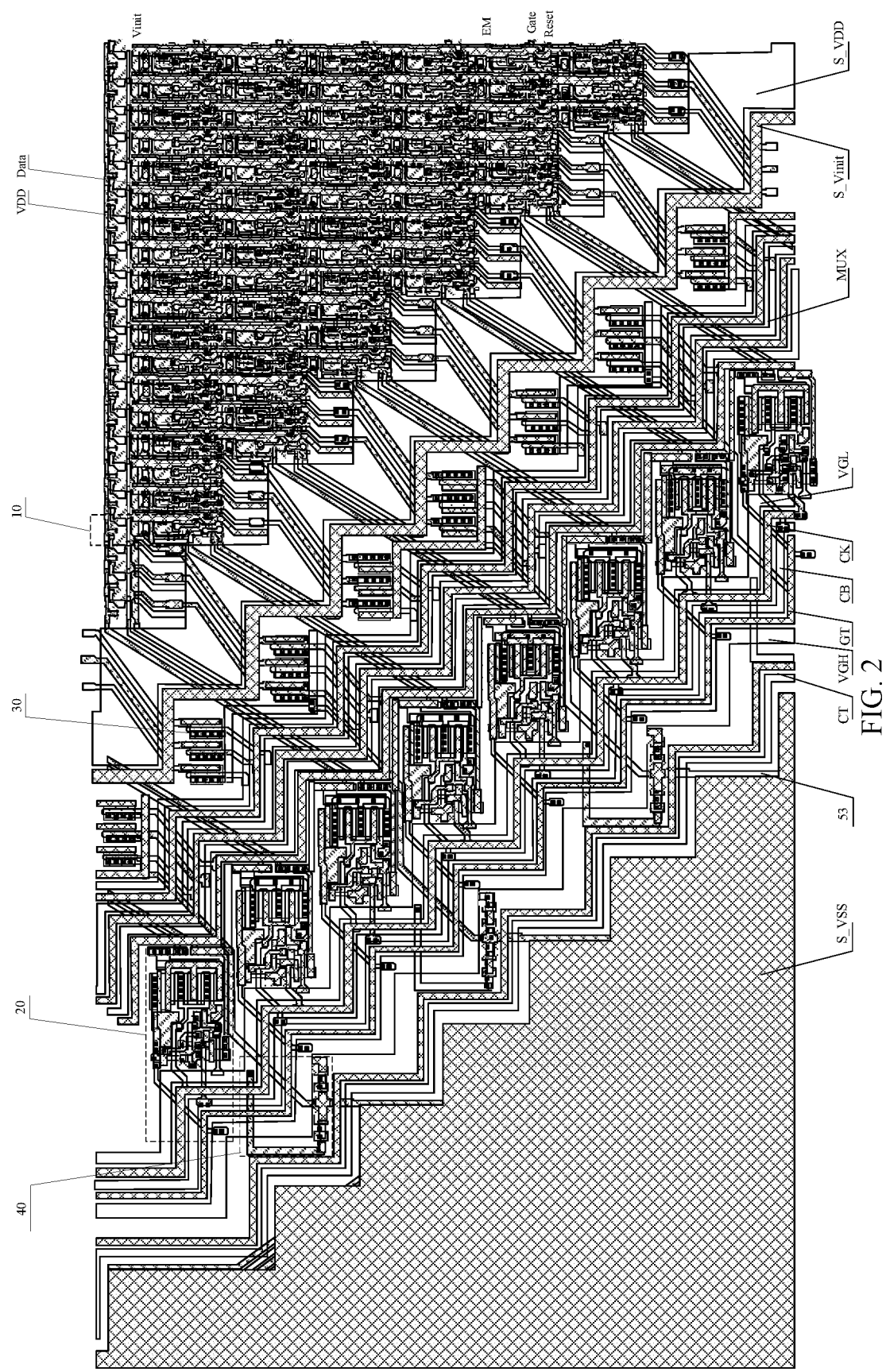
FIG. 2 is a layout of a region A1 in a display substrate according to an exemplary embodiment.

FIG. 2 is a layout of a region A1 in a display substrate according to an exemplary embodiment. As shown in FIGS. 1 and 2, in an exemplary embodiment, the display region may further include multiple first power lines VDD extending along a first direction and multiple initial signal lines Vinit extending along a second direction. The pixel circuit in each sub-pixel is electrically connected to a first power line VDD and an initial signal line Vinit respectively. The non-display region may further include a first power supply line S_VDD and an initial signal supply line S_Vinit.

In an exemplary embodiment, the first power supply line S_VDD and the initial signal supply line S_Vinit are in an annular shape.

The first power supply line S_VDD is located on a side of the multiple drive circuits close to the display region, and is electrically connected to the first power line VDD connected to each pixel circuit. The initial signal supply line S_Vinit is located between the multiple drive circuits and the first power supply line, and is electrically connected to the initial signal line connected to each pixel circuit.

In an exemplary embodiment, the first power supply line near the arc-shaped display boundary is in a terraced shape. The manner in which the first power supply line is disposed may can the narrow bezel of the display apparatus.

In an exemplary embodiment, when a shape of the display region is a rounded polygon, the first power supply line near a straight display boundary is in shape of a straight line.

In an exemplary embodiment, the initial signal supply line near the arc-shaped display boundary is in a terraced shape. The manner in which the initial signal supply line is disposed can realize the narrow bezel of the display apparatus.

In an exemplary embodiment, when the shape of the display region is a rounded polygon, the initial signal supply line near the straight display boundary is in shape of a straight line.

In an exemplary embodiment, a line width of the first power supply line is greater than that of the initial signal supply line.

In an exemplary embodiment, the display region further includes a second power line (not shown in the figure), and the light emitting element in each sub-pixel is electrically connected to the second power line. The non-display region further includes a second power supply line S_VSS, wherein the second power supply line is in an annular shape. The second power supply line is located on a side of the multiple drive circuits away from the display region, and is electrically connected to the second power supply line connected to each light emitting element.

A surface of the second power supply line near an arc-shaped display boundary near the display region is in a terraced shape, and a surface of the second power supply line near the arc-shaped display boundary away from the display region is arc-shaped. The manner in which the second power supply line is disposed may not only realize the narrow bezel of the display apparatus, but also reduce a resistance of the second power supply line.

In an exemplary embodiment, when the shape of the display region is a rounded polygon, the second power supply line close to a straight display boundary is in shape of a straight line.

In an exemplary embodiment, a line width of the second power supply line S_VSS is greater than that of the first power supply line S_VDD.

In an exemplary embodiment, as shown in FIG. 2, the display region further includes multiple light emission control lines EM and reset control lines Reset extending along the second direction, wherein the pixel circuit in each sub-pixel is electrically connected to a light emission control line and a reset control line.

The non-display region includes multiple control circuits which are cascaded and provide control signals to the multiple light emission control lines, wherein at least part of control circuits near an arc-shaped display boundary are disposed in a terraced manner.

In an exemplary embodiment, when the shape of the display region is a rounded polygon, multiple control circuits near a straight display boundary are disposed along the straight display boundary.

In an exemplary embodiment, the multiple drive circuits and the multiple control circuits are respectively located on a first side C1 and a second side C2 in the display region which are oppositely disposed.

In an exemplary embodiment, the non-display region further includes multiple multiplexing circuits 30, wherein the multiple multiplexing circuits 30 are located between the multiple drive circuits and the initial signal supply line S_Vinit, and are electrically connected to multiple data lines, configured to provide data signals to the data lines connected thereto.

At least a part of the multiplexing circuits 30 near an arc-shaped display boundary are disposed in a terraced manner. The manner in which the multiple multiplexing circuits are disposed can realize the narrow bezel of the display apparatus.

In an exemplary embodiment, when the shape of the display region is a rounded polygon, multiple multiplexing circuits near a straight display boundary are disposed along the straight display boundary.

In an exemplary embodiment, as shown in FIG. 2, the non-display region further includes multiple multiplexing control lines MUX and multiple multiplexing data lines 53, wherein each multiplexing circuit 30 is electrically connected to multiple multiplexing control lines MUX and one of the multiplexing data lines 53 respectively; and the multiple multiplexing control lines MUX are located between multiple drive circuits and multiple multiplexing circuits, and the multiple multiplexing control lines near the arc-shaped display boundary are in a terraced shape.

In an exemplary embodiment, when the shape of the display region is a rounded polygon, multiple multiplexing control lines near the straight display boundary are in a shape of a straight line.

In an exemplary embodiment, as shown in FIG. 2, the non-display region further includes multiple electrostatic discharge circuits 40. Each electrostatic discharge circuit 40 is connected to one signal line and is configured to discharge static electricity in the signal line connected to the electrostatic discharge circuit, and the signal line includes a multiplexing data line.

The multiple electrostatic discharge circuits 40 are located between the multiple drive circuits 20 and the second power supply line S_VSS. At a least part of the electrostatic discharge circuits near an arc-shaped display boundary are disposed in a terraced manner.

In an exemplary embodiment, when a shape of the display region is a rounded polygon, multiple electrostatic discharge circuits near a straight display boundary are disposed along the straight display boundary.

In an exemplary embodiment, as shown in FIG. 2, the non-display region further includes multiple test circuits (not shown in the figure) and a test control line CT. The test circuits are electrically connected to the test control line and the data line, respectively, and are configured to provide test signals to the data line.

In an exemplary embodiment, as shown in FIG. 1, the multiple test circuits are located on a third side C3 of the display region, wherein the third side C3 is different from the first side C1 and the second side C2.

As shown in FIG. 2, the test control line CT is located between the second power supply line S_VSS and the multiple electrostatic discharge circuits 40. The test control line near the arc-shaped display boundary is in a terraced shape.

In an exemplary embodiment, when the shape of the display region is a rounded polygon, a test control line near a straight display boundary is in shape of a straight line.

In an exemplary embodiment, as shown in FIG. 2, the non-display region further includes a third power line VGH and a fourth power line VGL. Each drive circuit is electrically connected to the third power line and the fourth power line respectively, wherein the third power line and the fourth power line are in an annular shape.

In an exemplary embodiment, the third power line VGH is located between the electrostatic discharge circuits 40 and the multiple drive circuits 20. The third power line VGH near an arc-shaped display boundary is in a terraced shape.

In an exemplary embodiment, when the shape of the display region is a rounded polygon, the third power line VGH near a straight display boundary is in shape of a straight line.

In an exemplary embodiment, the fourth power line VGL is located between a first clock signal line CK and the multiple drive circuits 20. The fourth power line VGL near the arc-shaped display boundary is in a terraced shape.

In an exemplary embodiment, when the shape of the display region is a rounded polygon, the fourth power line VGL near the straight display boundary is in shape of a straight line.

In an exemplary embodiment, as shown in FIG. 2, the non-display region further includes a first clock signal line CK, a second clock signal line CB, a signal input line and a signal output line (not shown in the figure), wherein each drive circuit is electrically connected to the first clock signal line CK, the second clock signal line CB, the signal input line and the signal output line respectively.

In an exemplary embodiment, the first clock signal line CK is located between the third power line VGH and the multiple drive circuits 20, and the first clock signal line CK near an arc-shaped display boundary is in a terraced shape.

In an exemplary embodiment, when the shape of the display region is a rounded polygon, the first clock signal line near the straight display boundary is in shape of a straight line.

In an exemplary embodiment, the second clock signal line CB is located between the third power line VGH and the first clock signal line CK, and the second clock signal line CB near the arc-shaped display boundary is in a terraced shape.

In an exemplary embodiment, when the shape of the display region is a rounded polygon, the second clock signal line CB near the straight display boundary is in shape of a straight line.

In an exemplary embodiment, a signal input line and a signal output line are located on a side of the drive circuit close to the display region.

In an exemplary embodiment, as shown in FIG. 2, the non-display region further includes a gate test line GT.

The gate test line GT is located between the third power line VGH and the second clock signal line CB, and is electrically connected to a last stage of drive circuit.

Figure 3:
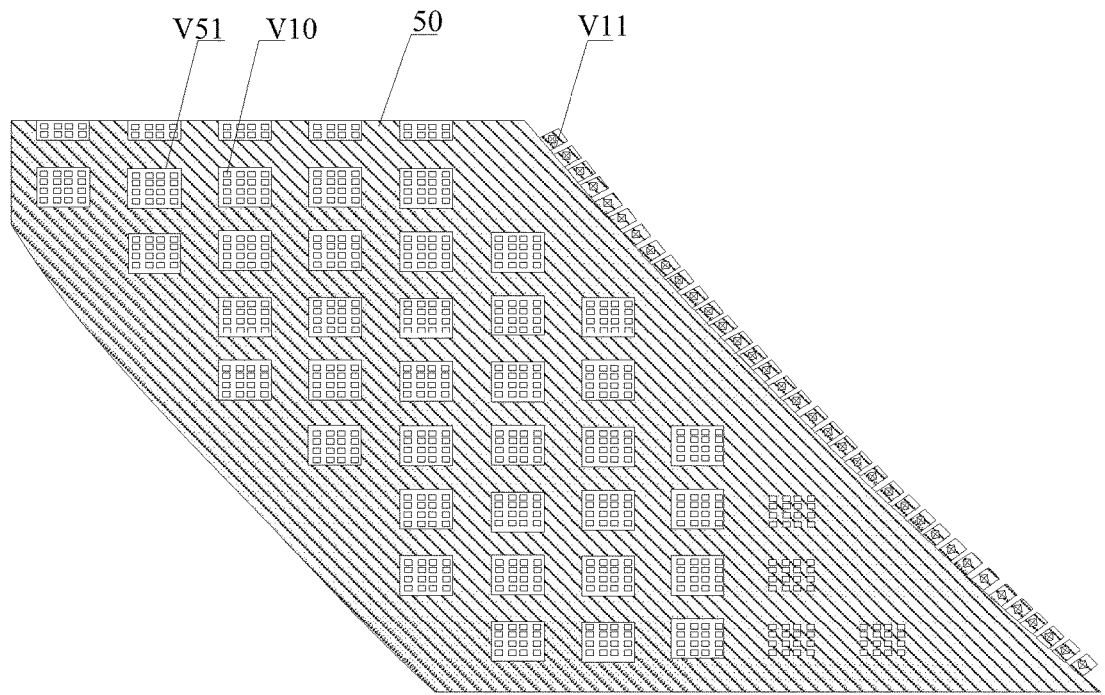
FIG. 3 is a schematic diagram of a structure of an encapsulation electrode according to an exemplary embodiment.
Figure 4:
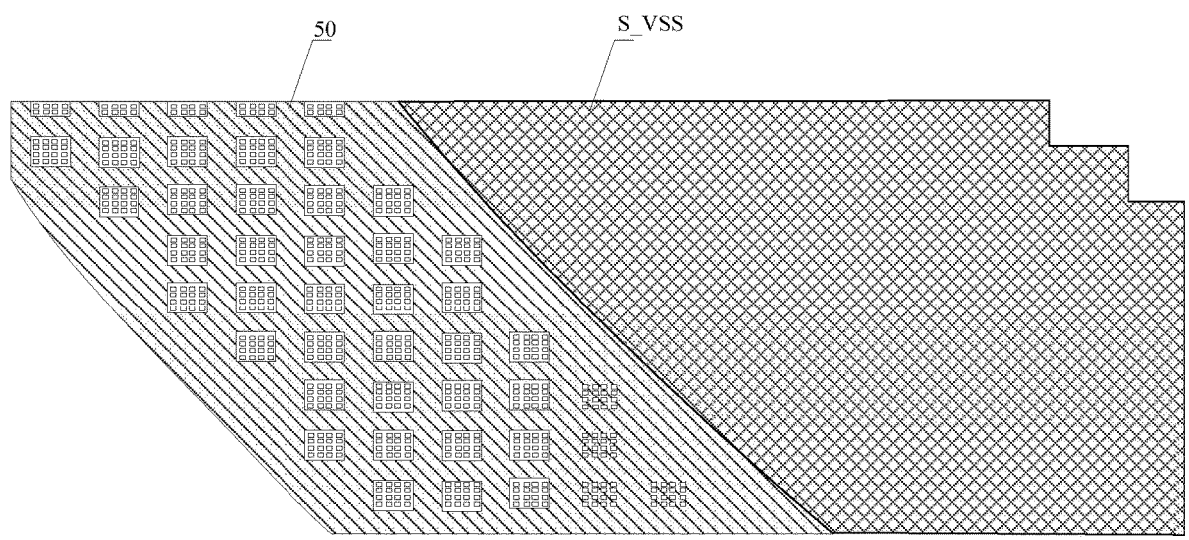
FIG. 4 is a partial schematic diagram of a region A2 of a display substrate according to an exemplary embodiment.

FIG. 3 is a schematic diagram of a structure of an encapsulation electrode according to an exemplary embodiment, and FIG. 4 is a partial schematic diagram of a region A2 of a display substrate according to an exemplary embodiment. As shown in FIGS. 3 and 4, the non-display region further includes an encapsulation electrode 50. The encapsulation electrode 50 is located on a side of the second power supply line away from the display region. The encapsulation electrode 50 is disposed in a different layer from the second power supply line S_VSS, and is electrically connected to the second power supply line S_VSS.

In an exemplary embodiment, the encapsulation electrode is provided with multiple via holes V51.

Figure 5A:
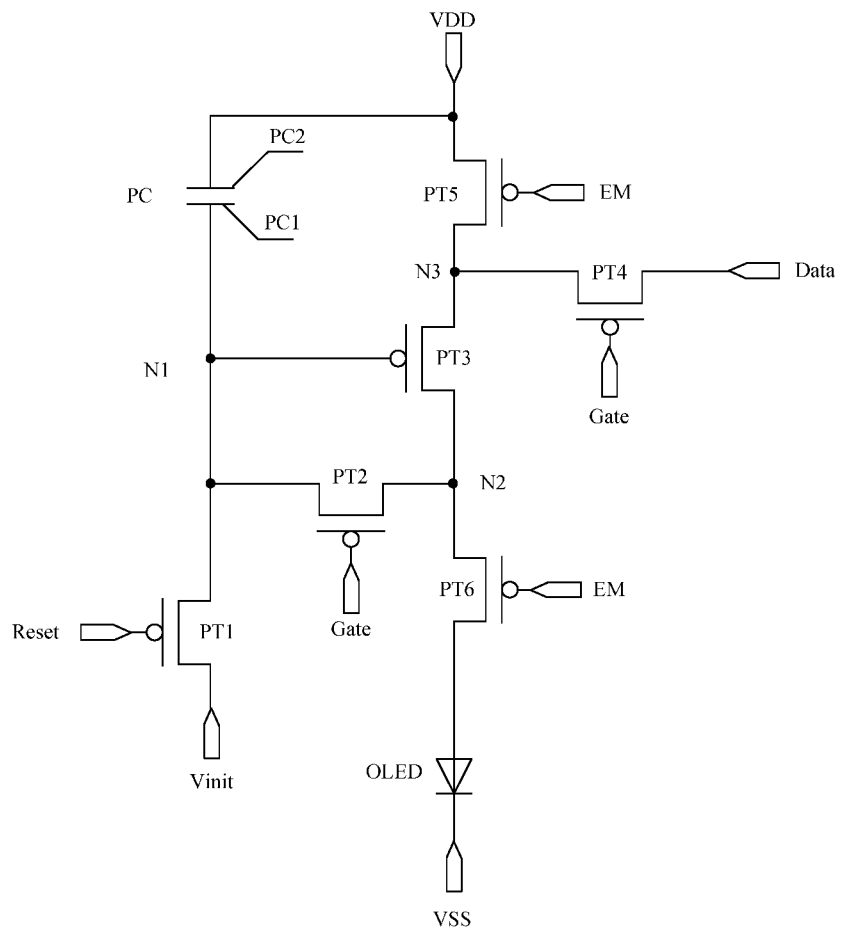
FIG. 5A is an equivalent circuit diagram of a pixel circuit according to an exemplary embodiment.

FIG. 5A is an equivalent circuit diagram of a pixel circuit according to an exemplary embodiment. As shown in FIG. 5A, in an exemplary embodiment, the pixel circuit is respectively connected to a first power line VDD, a data line Data, a gate line Gate, a reset signal line Reset, an initial signal line Vinit, a light emission control line EM and a light emitting element EM. The light emitting element is connected to a second power line VSS. The pixel circuit includes first to sixth pixel transistors PT1 to pixel transistor PT6 and a pixel storage capacitor PC. The pixel storage capacitor PC includes a first plate PC1 and a second plate PC2.

A control electrode of the first pixel transistor PT1 is electrically connected to the reset signal line Reset, a first electrode of the first pixel transistor PT1 is electrically connected to a first node N1, and a second electrode of the first pixel transistor PT1 is electrically connected to the initial signal line Vinit. A control electrode of the second pixel transistor PT2 is electrically connected to the gate line Gate, a first electrode of the second pixel transistor PT2 is electrically connected to the first node N1, and a second electrode of the second pixel transistor PT2 is electrically connected to the second node N2. A control electrode of the third pixel transistor PT3 is electrically connected to the first node N1, a first electrode of the third pixel transistor PT3 is electrically connected to a third node N3, and a second electrode of the third pixel transistor PT3 is electrically connected to the second node N2. A control electrode of the fourth pixel transistor PT4 is electrically connected to the gate line Gate, a first electrode of the fourth pixel transistor PT4 is electrically connected to the data line Data, and a second electrode of the fourth pixel transistor PT4 is electrically connected to the third node N3. A control electrode of the fifth pixel transistor PT5 is electrically connected to the light emission control line EM, a first electrode of the fifth pixel transistor PT5 is electrically connected to the first power line VDD, and a second electrode of the fifth pixel transistor PT5 is electrically connected to the third node N3. A control electrode of the sixth pixel transistor PT6 is electrically connected to the light emission control line EM, a first electrode of the sixth pixel transistor PT6 is electrically connected to the second node N2, and a second electrode of the sixth pixel transistor PT6 is electrically connected to the light emitting element. The first plate PC1 of the pixel storage capacitor PC is electrically connected to the first node N1, and the second plate PC2 of the pixel storage capacitor PC is electrically connected to the first power line VDD.

In an exemplary embodiment, the pixel circuit may have a 7T1C structure (i.e., including 7 transistors and 1 capacitor).

In an exemplary embodiment, the first power line VDD, the data line Data, the gate line Gate, the reset signal line Reset, the initial signal line Vinit and the light emission control line EM are located in the display region.

In an exemplary embodiment, the first power line VDD, the data line Data extend in a second direction and are disposed in a same layer. The gate line Gate, the reset signal line Reset, and the light emission control line EM extend along a first direction and are disposed in a same layer. The initial signal line Vinit extends in the first direction.

In an exemplary embodiment, the initial signal line Vinit is located on a side of the reset signal line Reset away from the gate line Gate, and the light emission control line EM is located on a side of the gate line Gate away from the reset signal line Reset.

In an exemplary embodiment, the first power line VDD is configured to continuously provide a high level signal, and the second power line VSS is configured to continuously provide a low level signal.

Figure 5B:
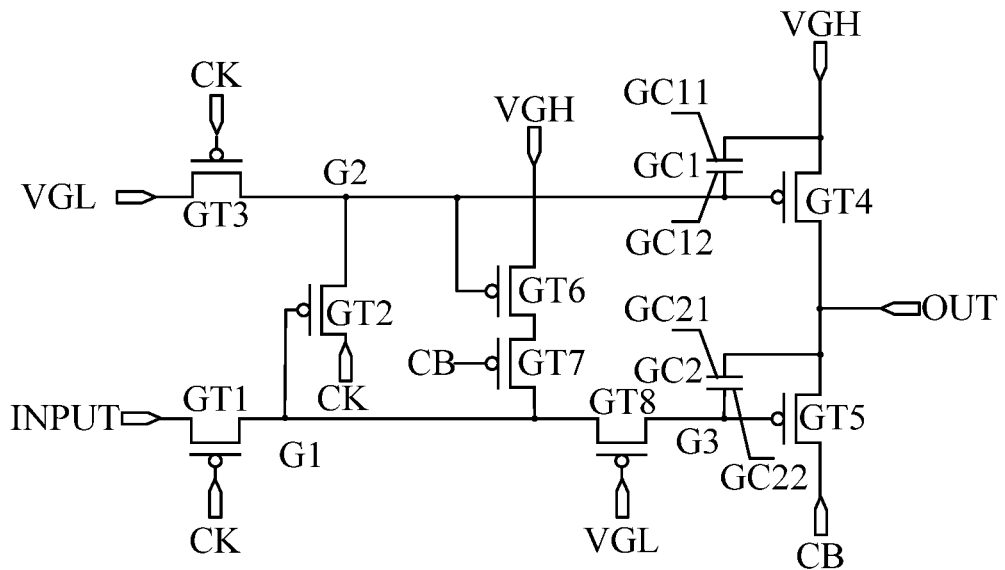
FIG. 5B is an equivalent circuit diagram of a drive circuit according to an exemplary embodiment.
Figure 5C:
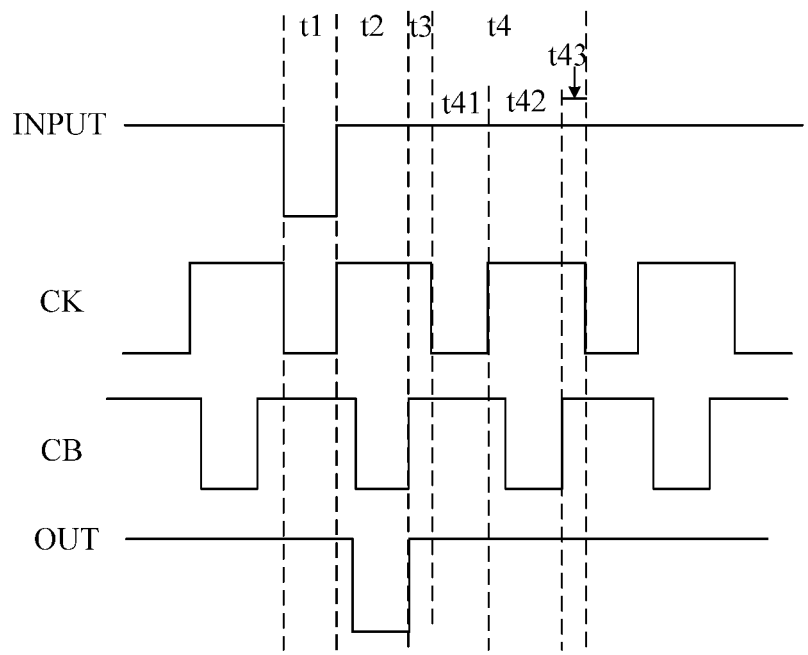
FIG. 5C is a timing sequence diagram of the drive circuit according to FIG. 5B.

FIG. 5B is an equivalent circuit diagram of a drive circuit according to an exemplary embodiment, and FIG. 5C is a timing sequence diagram of the drive circuit according to FIG. 5B. As shown in FIGS. 5B and 5C, in an exemplary embodiment, the drive circuit is electrically connected to a signal input line INPUT, a first clock signal line CK, a second clock signal line CB, a third power line VGH, a fourth power line VGL and a signal output line OUT, respectively.

In an exemplary embodiment, the drive circuit may be a gate shift register, and multiple gate shift registers are cascaded, so that the multiple gate shift registers may provide drive signals to multiple gate lines respectively.

As shown in FIG. 5B, the drive circuit includes first to eighth shift transistors GT1 to GT8, a first shift storage capacitor GC1 and a second shift storage capacitor GC2.

A control electrode of the first shift transistor GT1 is electrically connected to the first clock signal line CK, a first electrode of the first shift transistor GT1 is electrically connected to the signal input line INPUT, and a second electrode of the first shift transistor GT1 is electrically connected to the first node G1. A control electrode of the second shift transistor GT2 is electrically connected to the first node G1, a first electrode of the second shift transistor GT2 is electrically connected to the first clock signal line CK, and a second electrode of the second shift transistor GT2 is electrically connected to the second node G2. A control electrode of the third shift transistor GT3 is electrically connected to the first clock signal line CK, a first electrode of the third shift transistor GT3 is electrically connected to the fourth power line VGL, and a second electrode of the third shift transistor GT3 is electrically connected to the second node G2. A control electrode of the fourth shift transistor GT4 is electrically connected to the second node G2, a first electrode of the fourth shift transistor GT4 is electrically connected to the third power line VGH, and a second electrode of the fourth shift transistor GT4 is electrically connected to the signal output line OUT. A control electrode of the fifth shift transistor GT5 is electrically connected to the third node G3, a first electrode of the fifth shift transistor GT5 is electrically connected to the second clock signal line CB, and a second electrode of the fifth shift transistor GT5 is electrically connected to the signal output line OUT. A control electrode of the sixth shift transistor GT6 is electrically connected to the second node G2, a first electrode of the sixth shift transistor GT6 is electrically connected to the third power line VGH, and a second electrode of the sixth shift transistor GT6 is electrically connected to a first electrode of the seventh shift transistor GT7. A control electrode of the seventh shift transistor GT7 is electrically connected to the second clock signal line CB, and a second electrode of the seventh shift transistor GT7 is electrically connected to the first node G1. A control electrode of the eighth shift transistor GT8 is electrically connected to a fourth power line VGL, a first electrode of the eighth shift transistor GT8 is electrically connected to the first node G1, and a second electrode of the eighth shift transistor GT8 is electrically connected to the third node G3. A first plate GC11 of the first shift storage capacitor GC1 is electrically connected to the third power line VGH, and a second plate GC12 of the first shift storage capacitor GC1 is electrically connected to the second node G2. A first plate GC21 of the second shift storage capacitor GC2 is electrically connected to the signal output line OUT, and a second plate GC22 of the second shift storage capacitor GC2 is electrically connected to the third node G3.

In an exemplary embodiment, the third power line VGH continuously provides a high level signal, and the fourth power line VGL continuously provides a low level signal.

In an exemplary embodiment, the first shift transistor GT1 to the eighth shift transistor GT8 may be P-type transistors or may be N-type transistors.

Taking the first shift transistor GT1 to the eighth shift transistor GT8 being P-type transistors as an example, as shown in FIG. 5C, a working process of the drive circuit according to an exemplary embodiment includes the following stages:

In an input stage t1, a signal of the first clock signal line CK is at a low level, a signal of the second clock signal line CB is at a high level, and a signal of the signal input terminal INPUT is at a low level. Since the signal of the first clock signal line CK is at a low level, the first shift transistor GT1 is turned on, and the signal of the signal input terminal INPUT is transmitted to the first node G1 via the first shift transistor GT1. Since the eighth shift transistor GT8 receives the signal of the fourth power line VGL with a low level, the eighth shift transistor GT8 is in a turned-on state. The level of the third node G3 may control the fifth shift transistor GT5 to turn on, and the signal of the second clock signal line CB is transmitted to the signal output line OUT via the fifth shift transistor GT5, that is, in the input stage t1, the signal output line OUT is the signal of the second clock signal line CB with a high level. In addition, since the signal of the first clock signal line CK is at a low level, the third shift transistor GT3 is turned on, and the signal of the fourth power line VGL with a low level is transmitted to the second node G2 via the third shift transistor GT3. At this time, both the fourth shift transistor GT4 and the sixth shift transistor GT6 are turned on. Since the signal of the second clock signal line CB is at a high level, the seventh shift transistor GT7 is turned off.

In an output stage t2, the signal of the first clock signal line CK is at a high level, the signal of the second clock signal line CB is at a low level, and the signal of the signal input terminal INPUT is at a high level. The fifth shift transistor GT5 is turned on, and the signal of the second clock signal line CB is used as a signal of the signal output terminal OUT via the fifth shift transistor GT5. In the output stage t2, a level of one end of the second shift storage capacitor GC2 connected to the output terminal OUT becomes the signal of the fourth power line VGL. Due to a bootstrap effect of the second shift storage capacitor GC2, the eighth shift transistor GT8 is turned off, the fifth shift transistor GT5 can be turned on more easily, and the signal of the signal output terminal OUT is at a low level. In addition, the signal of the first clock signal line CK is at a high level, so that both the first shift transistor GT1 and the third shift transistor GT3 are turned off. The second shift transistor GT2 is turned on, and the high level of the first clock signal line CK is transmitted to the second node G2 via the second shift transistor GT2, whereby both the fourth shift transistor GT4 and the sixth shift transistor GT6 are turned off. Since the signal of the second clock signal line CB is at a low level, the seventh shift transistor GT7 is turned on.

In a buffer stage t3, signals of the first clock signal line CK and the second gate clock signal CB are both at a high level, the signal of the signal input terminal INPUT is at a high level, the fifth shift transistor GT5 is turned on, and the second gate clock signal CB is used as a gate output signal GOUT via the fifth shift transistor GT5. At this time, the gate output signal GOUT is the second gate clock signal CB with a high level, that is, VGH. A level of the first gate node N1 turns into VGL-VthN1 due to the bootstrap effect of a second gate capacitor C2. In addition, the signal of the first clock signal line CK is at a high level, so that the first shift transistor GT1 and the third shift transistor GT3 are turned off, the eighth shift transistor GT8 is turned on, and the second shift transistor GT2 is turned on. The signal of the first clock signal line CK with a high level is transmitted to the second node G2 via the second shift transistor GT2, thereby the fourth shift transistor GT4 and the sixth shift transistor GT6 are turned off. Since the signal of the second clock signal line CB is at a high level, the seventh shift transistor GT7 is turned off.

In a first sub-stage t41 of a stabilization stage t4, the signal of the first clock signal line CK is at a low level, the signal of the second clock signal CB is at a high level, and the signal of the signal input terminal INPUT is at a high level. Since the signal of the first clock signal line CK is at a low level, the first shift transistor GT1 is turned on, the signal of the signal input terminal INPUT is transmitted to the first node G1 via the first shift transistor GT1, and the second shift transistor GT2 is turned off. Since the eighth shift transistor GT8 is in an turned-on state, the fifth shift transistor GT5 is turned off. Since the signal of the first clock signal line CK is at a low level, the third shift transistor GT3 is turned on, the fourth shift transistor GT4 and the sixth shift transistor GT6 are both turned on, and the signal of the third power line VGH with a high level is transmitted to the signal output line OUT via the fourth shift transistor GT4, that is, the gate output signal is a high level signal.

In a second sub-stage t42 of the stabilization stage t4, the signal of the first clock signal line CK is at a high level, the signal of the second clock signal CB is at a low level, and the signal of the signal input terminal INPUT is at a high level. The fifth shift transistor GT5 and the second shift transistor GT2 are both turned off. The signal of the first clock signal line CK is at a high level, so that the first shift transistor GT1 and the third shift transistor GT3 are both turned off. Due to a holding action of the first shift storage capacitor C1, the fourth shift transistor GT4 and the sixth shift transistor GT6 are both turned on, and the high level signal is transmitted to the signal output line OUT via the fourth shift transistor GT4, that is, the gate output signal is at a high level.

In the second sub-stage t42, since the signal of the second clock signal line CB is at a low level, the seventh shift transistor GT7 is turned on, so that the high-level signal is transmitted to the third node G3 and the first node G1 via the sixth shift transistor GT6 and the seventh shift transistor GT7, so that the signals of the third node G3 and the first node G1 are kept at a high level.

In a third sub-stage t43, signals of the first clock signal line CK and the second gate clock signal CB are both at a high level, and the signal of the input signal terminal INPUT is at a high level. The fifth shift transistor GT5 and the second shift transistor GT2 are turned off. The signal of the first clock signal line CK is at a high level, so that both the first shift transistor GT1 and the third shift transistor GT3 are turned off, and both the fourth shift transistor GT4 and the sixth shift transistor GT6 are turned on. The high level signal reaches the signal output line OUT via the fourth shift transistor GT4, that is, the gate output signal is a high level signal.

Figure 5D:
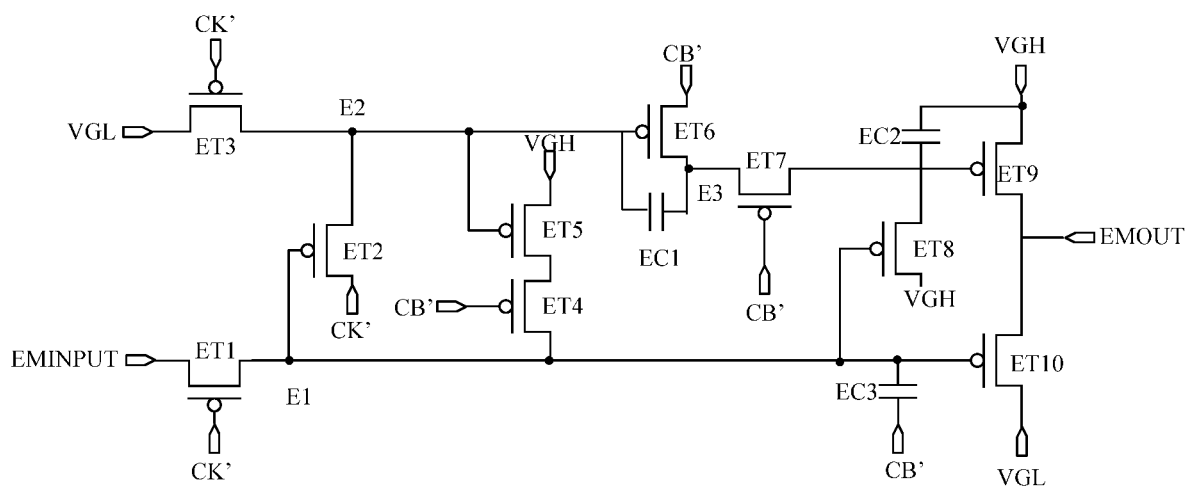
FIG. 5D is an equivalent circuit diagram of a control circuit according to an exemplary embodiment.
Figure 5E:
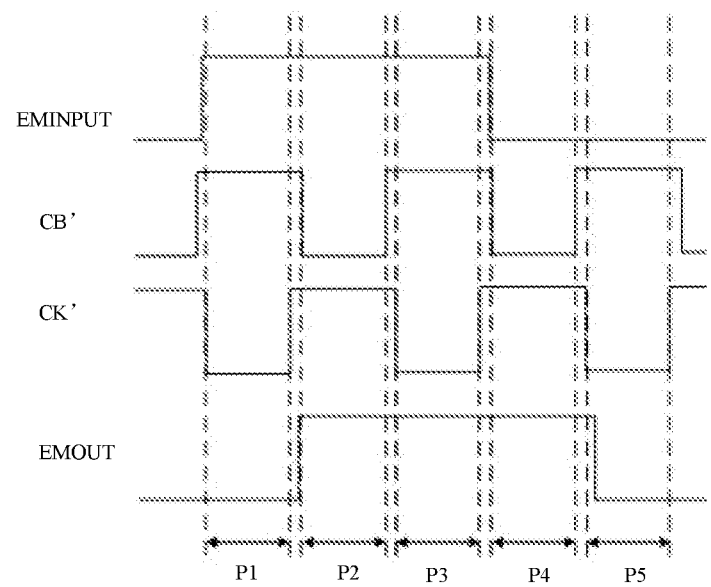
FIG. 5E is a timing sequence diagram of the control circuit according to FIG. 5D.

FIG. 5D is an equivalent circuit diagram of a control circuit according to an exemplary embodiment, and FIG. 5E is a timing sequence diagram of the control circuit according to FIG. 5D. As shown in FIGS. 5D and 5E, in an exemplary embodiment, the control circuit is electrically connected to a control input line EMINPUT, a third clock signal line CK', a fourth clock signal line CB', a third power line VGH, a fourth power line VGL and a control output line EMOUT, respectively.

In an exemplary embodiment, each control circuit may be a control electrode shift register, and multiple control electrode shift registers are cascaded, so that the multiple control electrode shift registers may respectively provide drive signals to multiple light emission control lines.

As shown in FIG. 5D, the drive circuit includes first to tenth control transistors ET1 to ET10 and first to third control storage capacitors EC1 to EC3.

A control electrode of the first control transistor ET1 is electrically connected to the third clock signal line CK', a first electrode of the first control transistor ET1 is electrically connected to the control input line EMINPUT, and a second electrode of the first control transistor ET1 is electrically connected to a first node E1. A control electrode of the second control transistor ET2 is electrically connected to the first node E1, a first electrode of the second control transistor ET2 is electrically connected to the third clock signal line CK', and a second electrode of the second control transistor ET2 is electrically connected to a second node E2. A control electrode of the third control transistor ET3 is electrically connected to the third clock signal line CK', a first electrode of the third control transistor ET3 is electrically connected to the fourth power line VGL, and a second electrode of the third control transistor ET3 is electrically connected to the second node E2. A control electrode of the fourth control transistor ET4 is electrically connected to the fourth clock signal line CB', a first electrode of the fourth control transistor ET4 is electrically connected to the first node E1, and a second electrode of the fourth control transistor ET4 is electrically connected to a first electrode of the fifth control transistor ET5. A control electrode of the fifth control transistor ET5 is electrically connected to the second node E2, and a second electrode of the fifth control transistor ET5 is electrically connected to the third power line VGH. A control electrode of the sixth control transistor ET6 is electrically connected to the second node E2, a first electrode of the sixth control transistor ET6 is electrically connected to the fourth clock signal line CB', and a second electrode of the sixth control transistor ET6 is electrically connected to a third node E3. A control electrode of the seventh control transistor ET7 is electrically connected to the fourth clock signal line CB', and a second electrode of the seventh control transistor ET7 is electrically connected to a control electrode of the ninth control transistor ET9. A control electrode of the eighth control transistor ET8 is electrically connected to the first node E1, a first electrode of the eighth control transistor ET8 is electrically connected to the third power line VGH, and a second electrode of the eighth control transistor ET8 is electrically connected to one plate of the second control storage capacitor EC. A first electrode of the ninth control transistor ET9 is electrically connected to the third power line VGH, and a second electrode of the ninth control transistor ET9 is electrically connected to the control output line EMOUT. A control electrode of the tenth control transistor ET10 is electrically connected to the first node E1, a first electrode of the tenth control transistor ET10 is electrically connected to the fourth power line VGL, and a second electrode of the tenth control transistor ET10 is electrically connected to the control output line EMOUT. One plate of the first control storage capacitor EC1 is electrically connected to the second node E2, and the other plate of the first control storage capacitor EC1 is electrically connected to the third node E3. The other plate of the second control storage capacitor EC2 is electrically connected to the third power line VGH. One plate of the third control storage capacitor EC3 is electrically connected to the first node E1, and the other plate of the third control storage capacitor EC3 is electrically connected to the fourth clock signal line CB'.

In an exemplary embodiment, the first control transistor ET1 to the tenth control transistor ET10 may be P-type transistors or may be N-type transistors.

Taking the first control transistor ET1 to the tenth control transistor ET10 being N-type transistors as an example, wherein low levels of the following signals may be equal to a low level of the fourth power line VGL, and high levels of the signals may be equal to a high level of the third power line VGH. As shown in FIG. 5E, a working process of the control circuit according to an exemplary embodiment includes the following stages:

In a first stage P1, a signal of the third clock signal line CK' is at a low level, so the first control transistor ET1 and the third control transistor ET3 are turned on, and the turned-on first control transistor ET1 transmits a signal of the control output terminal EMINPUT with a high level to the first node E1, so that a level of the first node E1 turns into high level, then the second control transistor ET2, the eighth control transistor ET8 and the tenth control transistor ET10 are turned off In addition, the turned-on third control transistor ET3 transmits a signal of the third power line VGL with a low level to the second node E2, so that a level of the second node E2 turns into low level, then the fifth control transistor ET5 and the sixth control transistor ET6 are turned on. Since a signal of the fourth clock signal line CB' is at a high level, the seventh control transistor ET7 is turned off In addition, the ninth control transistor ET9 is turned off due to a storage effect of the third control storage capacitor EC3. In the first stage P1, since both the ninth control transistor ET9 and the tenth control transistor ET10 are turned off, a signal of the control output line EMOUT is kept at a previous low level.

In a second stage P2, the signal of the fourth clock signal line CB' is at a low level, so the fourth control transistor ET4 and the seventh control transistor ET7 are turned on. Since the signal of the third clock signal line CK' is at a high level, the first control transistor ET1 and the third control transistor ET3 are turned off due to a storage effect of the first control storage capacitor EC1, the second node E2 may continue keeping the low level of the previous stage, so that the fifth control transistor ET5 and the sixth control transistor ET6 are turned on. A signal of the third power line VGH with a high level is transmitted to the first node E1 via the fifth control transistor ET5 and the fourth control transistor ET4 which are turned on, so that a level of the first node E1 continues keeping a high level of the previous stage, so the second control transistor ET2, the eighth control transistor ET8 and the tenth control transistor ET10 are turned off. In addition, the signal of the fourth clock signal line CB' with a low level is transmitted to the control electrode of the ninth control transistor ET9 via the sixth control transistor ET6 and the seventh control transistor ET7 which are turned on, the ninth control transistor ET9 is turned on and the turned-on ninth control transistor ET9 outputs the signal of the third power line VGH with a high level, so the signal of the control output line EMOUT is at a high level.

In a third stage P3, the signal of the third clock signal line CK' is at a low level, so the first control transistor ET1 and the third control transistor ET3 are turned on. Since the signal of the fourth clock signal line CB is at a high level, the fourth control transistor ET4 and the seventh control transistor ET7 are turned off. Due to a storage effect of the third control storage capacitor EC3, the ninth control transistor ET9 keeps a turned-on state, and the turned-on ninth control transistor ET9 outputs the signal of the third power line VGH with a high level, and the signal of the control output line EMOUT is still at a high level.

In a fourth stage P4, the signal of the third clock signal line CK' is at a high level, so the first control transistor ET1 and the third control transistor ET3 are turned off. The signal of the fourth clock signal line CB' is at a low level, so the fourth control transistor ET4 and the seventh control transistor ET7 are turned on. Due to a storage effect of the second control storage capacitor EC2, the level of the first node E1 keeps the high level of the previous stage, so that the second control transistor ET2, the eighth control transistor ET8 and the tenth control transistor ET10 are turned off. Due to a storage effect of the first control storage capacitor EC1, the second node E2 continues keeping the low level of the previous stage, so that the fifth control transistor ET5 and the sixth control transistor ET6 are turned on. In addition, the signal of the fourth clock signal line CB' with a low level is transmitted to the control electrode of the ninth control transistor ET9 via the sixth control transistor ET6 and the seventh control transistor ET7 which are turned on, so the ninth control transistor ET9 is turned on and the turned-on ninth control transistor ET9 outputs the signal of the third power line VGH with a high level, then the signal of the control output line EMOUT is still at a high level.

In a fifth stage P5, the signal of the third clock signal line CK' is at a low level, so the first control transistor ET1 and the third control transistor ET3 are turned on. Since the signal of the fourth clock signal line CB' is at a high level, the fourth control transistor ET4 and the seventh control transistor ET7 are turned off. The turned-on first control transistor ET1 transmits a signal of the control input line EMINPUT with a high level to the first node E1, so that the level of the first node E1 turns into low level, then the second control transistor ET2, the eighth control transistor ET8, and the tenth control transistor ET10 are turned on. The turned-on second control transistor ET2 transmits the signal of the third clock signal line CK' with a low level to the second node E2, so that the level of the second node E2 may be further lowered and the second node E2 continues keeping the low level of the previous stage, and thus the fifth control transistor ET5 and the sixth control transistor ET6 are turned on. In addition, the turned-on eighth control transistor ET8 transmits the signal of the third power line VGH with a high level to the control electrode of the ninth control transistor ET9, so the ninth control transistor ET9 is turned off. The turned-on tenth control transistor ET10 outputs the signal of the fourth power line VGL with a low level, then the signal of the control output line EMOUT turns into a low level.

Figure 5F:
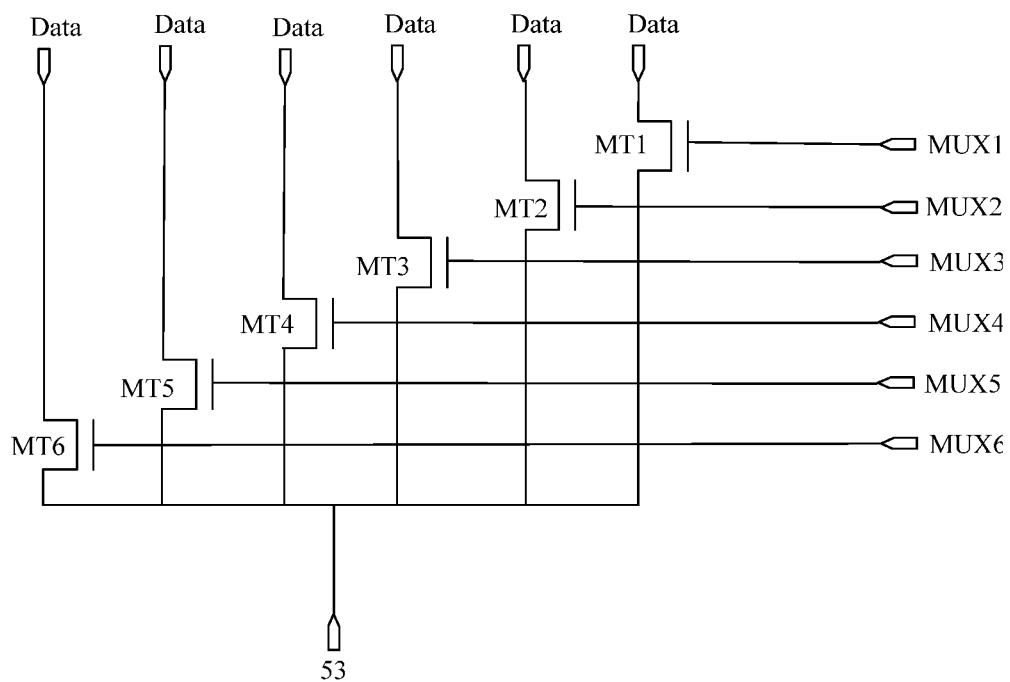
FIG. 5F is an equivalent circuit diagram of a multiplexing circuit according to an exemplary embodiment.

FIG. 5F is an equivalent circuit diagram of a multiplexing circuit according to an exemplary embodiment. As shown in FIG. 5F, at least one multiplexing circuit includes multiple multiplexing transistors, wherein a gate of each multiplexing transistor is connected to one multiplexing control line, a first electrode of the multiplexing transistor is connected to one data line Data, and a second electrode of the multiplexing transistor is connected to one multiplexing data line 53. FIG. 5F illustrates an example in which the multiplexing circuit includes six multiplexing transistors MT1 to MT6.

In an exemplary embodiment, the number of the multiplexing transistors included in the multiplexing circuit depends on the number of multiplexing data lines.

In an exemplary embodiment, second electrodes of all multiplexing transistors of a same multiplexing circuit are connected to one same multiplexing data line, and second electrodes of multiplexing transistors of different multiplexing circuits are connected to different multiplexing data lines.

In an exemplary embodiment, during displaying, a turned-on signal (a signal that enables transistors to turn on) may flow into multiple multiplexing control lines in turn, so that one multiplexing data line may be turned on with multiple different data lines in turn via multiple multiplexing transistors in one multiplexing circuit, thereby providing required data signals to the multiple data lines respectively through one multiplexing data line. That is, control of the multiple data lines 11 is realized by one signal source (e.g., a connector 6) (i.e., "one-to-many", e.g., one-to-six), so that the number of signal sources providing signals for data lines is much smaller than the number of the data lines, so as to simplify product structures, for example, to reduce the number of drive chips required.

From a perspective of simplifying the structure, the number of the multiplexing control lines may be equal to the number of the multiplexing transistors in each multiplexing circuit (for example, they are both six), that is, the multiple multiplexing transistors in each multiplexing circuit may be connected to different multiplexing control lines, wherein each multiplexing control line is connected to one multiplexing transistor in each multiplexing circuit.

In an exemplary embodiment, since a multiplexing control line is connected to multiple multiplexing circuits, the multiplexing control line may have a part extending along a circumferential direction of the non-display region, and different positions on the part are respectively connected to different multiplexing circuits. Each multiplexing data line is connected to only one multiplexing circuit, so each multiplexing data line may be directly connected to a corresponding multiplexing circuit.

Figure 5G:
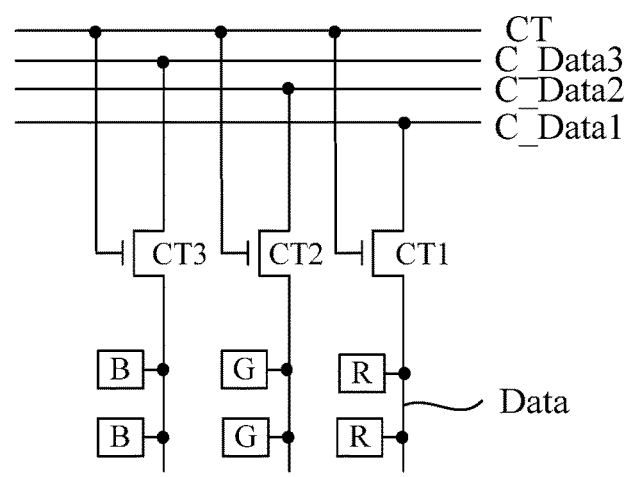
FIG. 5G is an equivalent circuit diagram of a test circuit according to an exemplary embodiment.

FIG. 5G is an equivalent circuit diagram of a test circuit according to an exemplary embodiment. As shown in FIG. 5G, in an exemplary embodiment, the test circuit is electrically connected to a test signal line CT and test data lines, respectively. At least one test circuit includes multiple test transistors, wherein a gate of each test transistor is connected to one test control line CT, a first electrode of the test transistor is connected to one data line Data, and a second electrode of the test transistor is connected to one test data line. FIG. 5G illustrates that the test circuit includes three test transistors: first to third test transistors CT1 to CT3, and the test data lines include first to third test data lines C_Data1 to C_Data3.

In an exemplary embodiment, each test data line is connected to multiple test circuits.

In an exemplary embodiment, during testing, signals in the test signal lines may enter multiple corresponding data lines via test transistors in different test circuits by inputting a turned-on signal to the test control line CT, so as to realize a detection of the display apparatus.

In an exemplary embodiment, since each test data line is connected to multiple test circuits, the number of the test data lines is far smaller than the number of the multiplexing data lines. Therefore, although the test circuit is located above the display apparatus, since the control of the test circuit may be realized only by a few test signal lines extending to the test circuit, these few test signal lines will not occupy a large layout area.

In an exemplary embodiment, corresponding relations between test data lines, test control lines and test circuits may be varied.

In an exemplary embodiment, the number of test data lines may be equal to the number of test transistors in each test circuit (for example, they are both three), while there is only one test control line, that is, each test data line is connected to a second electrode of one test transistor in each test circuit, while first electrodes of different test transistors are connected to different data lines 11, and gates of all the test transistors in all the test circuits are connected to the test control line.

In an exemplary embodiment, sub-pixels connected to each data line may have a same color (R stands for a red sub-pixel 1, G stands for a green sub-pixel 1, and B stands for a blue sub-pixel 1 in the figures), and sub-pixels connected to corresponding data lines of each test data line have a same color. Therefore, the sub-pixels with a same color may display a same brightness (e.g., displaying a white picture or other monochrome picture as a whole) by continuously inputting a same test signal to the test data lines, which is convenient for locating defective sub-pixels.

In an exemplary embodiment, a multiplexing signal line includes a multiplex control line and a multiplexing data line, and a test signal line includes a test control line and a test data line. Generally speaking, the number of the multiplexing signal lines is far larger than the total number of the test signal lines, so a larger number of the multiplexing signal lines may be connected to the multiplexing circuit "nearby". Although the test signal lines need to extend a long distance to be connected with the test circuit, the total length of their leads will not be too large because of the small number of the test signal lines, therefore, the above design can reduce the total length of the leads and the layout area occupied, reduce a bezel of the display apparatus, and improve a screen-to-body ratio.

Figure 5H:
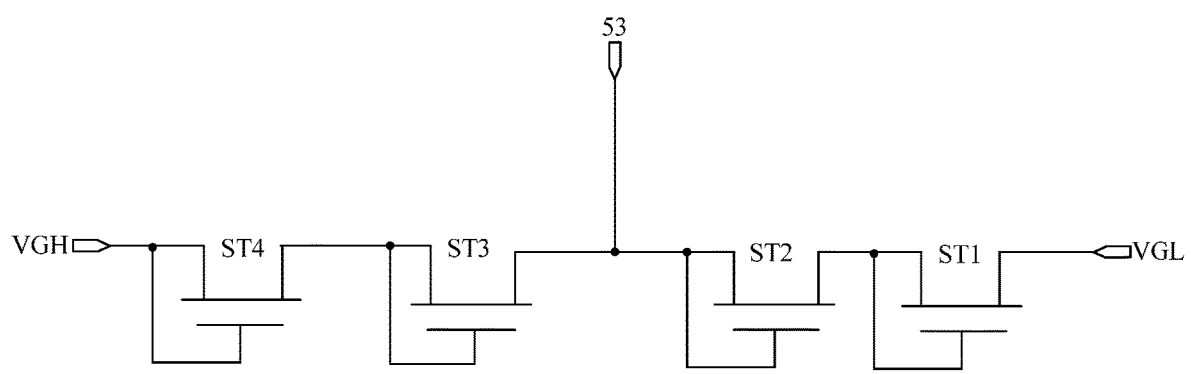
FIG. 5H is an equivalent circuit diagram of an electrostatic discharge circuit according to an exemplary embodiment.

FIG. 5H is an equivalent circuit diagram of an electrostatic discharge circuit according to an exemplary embodiment. As shown in FIG. 5H, in an exemplary embodiment, at least one electrostatic discharge circuit is connected to one signal line and is configured to discharge static electricity in the signal line connected with the electrostatic discharge circuit, wherein the signal line is a multiplexing data line 53. The electrostatic discharge circuit includes first to fourth discharge transistors ST1 to ST4.

A control electrode and a first electrode of the first discharge transistor ST1 are electrically connected to the fourth power line VGL. A second electrode of the first discharge transistor ST1 is electrically connected to a first electrode of the second discharge transistor ST2, a control electrode and a second electrode of the second discharge transistor ST2 are electrically connected to the signal line corresponding to the electrostatic discharge circuit. A first electrode of the third discharge transistor ST3 is electrically connected to the signal line corresponding to the electrostatic discharge circuit. A control electrode and a second electrode of the third discharge transistor ST3 are electrically connected to a first electrode of the fourth discharge transistor ST4 and a control electrode and a second electrode of the fourth discharge transistor ST4 are electrically connected to the third power line VGH.

In an exemplary embodiment, damage due to discharge breakdown caused by static electricity accumulation in the signal line may be prevented by arrangement of the electrostatic discharge circuit, so as to release the static electricity accumulated in the signal line and realize a protection of the signal line.

In an exemplary embodiment, a signal line connected to each electrostatic discharge circuit may be a test signal line. There may be multiple electrostatic discharge circuits, which are respectively connected to the above test signal lines and multiplexing data lines to protect them.

In an exemplary embodiment, the electrostatic discharge circuit may include two discharge transistors, wherein one electrode of each discharge transistor is connected to its own gate, thereby forming an equivalent diode connection. A signal line to be protected is connected between the two "diodes", and another two terminals of the two "diodes" are respectively connected to the third power line VGH and the fourth power line VGL. Therefore, when an instantaneous high voltage (e.g., 100V) occurs due to an accumulation of positive charges in the signal line, one of the "diodes" is turned on to release the positive charges in the signal line, and when an instantaneous low voltage (e.g. −100V) occurs due to an accumulation of negative charges in the signal line, the other "diode" is turned on to release the negative charges in the signal line.

Figure 6:
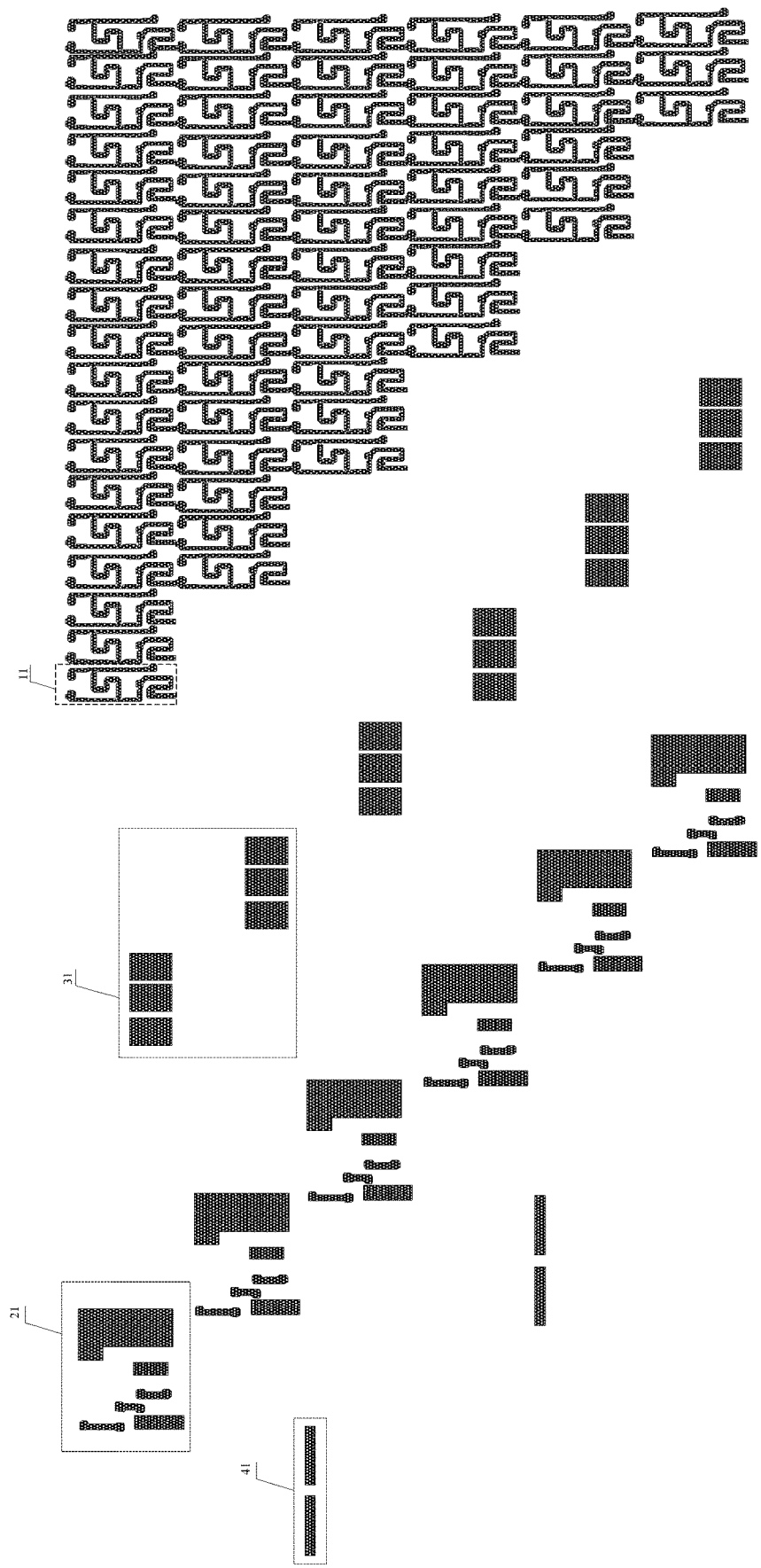
FIG. 6 is a schematic diagram of a film layer of an active layer of a display substrate according to an exemplary embodiment.
Figure 7:
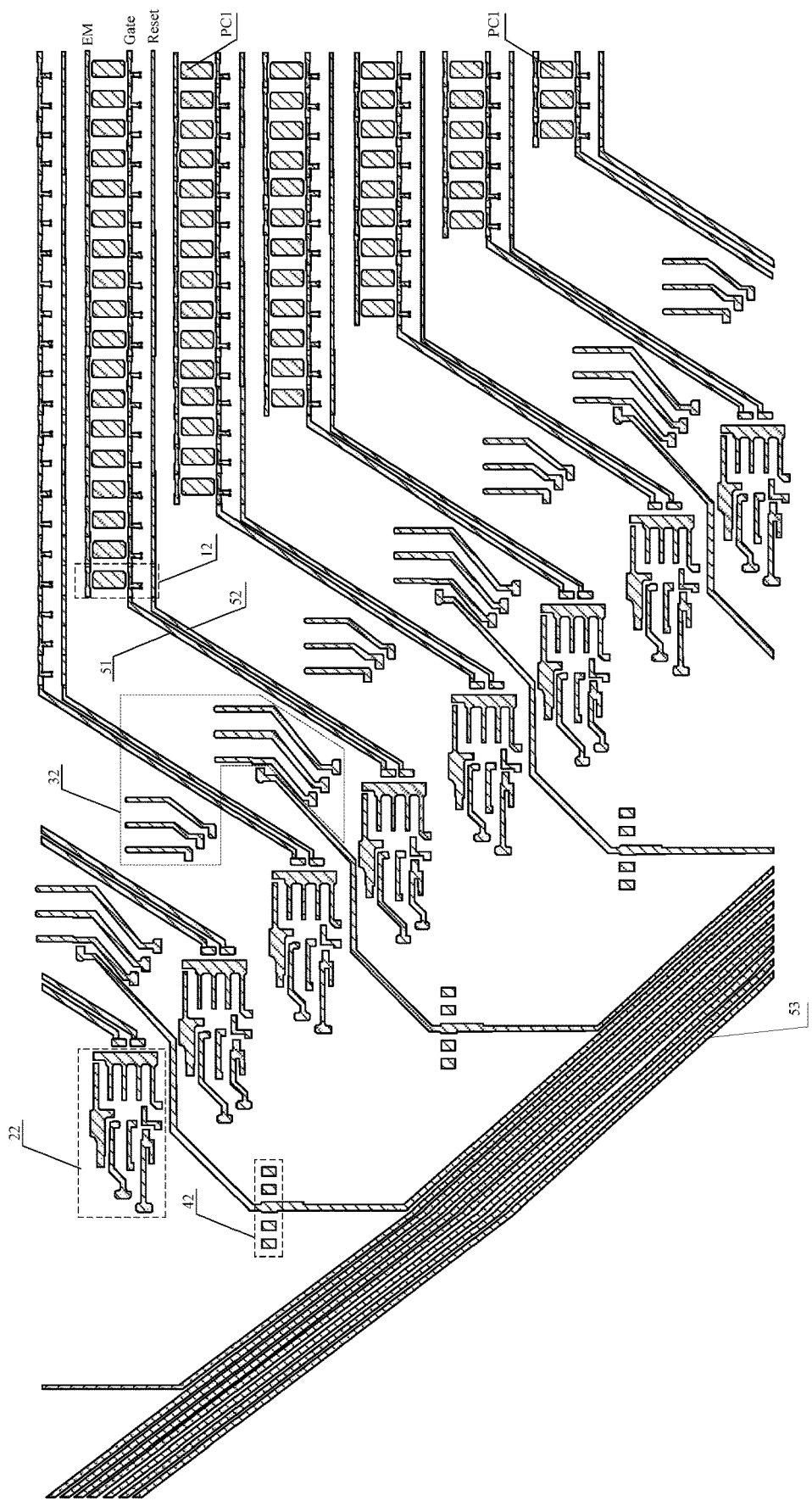
FIG. 7 is a schematic diagram of a film layer of a first metal layer of a display substrate according to an exemplary embodiment.
Figure 8:
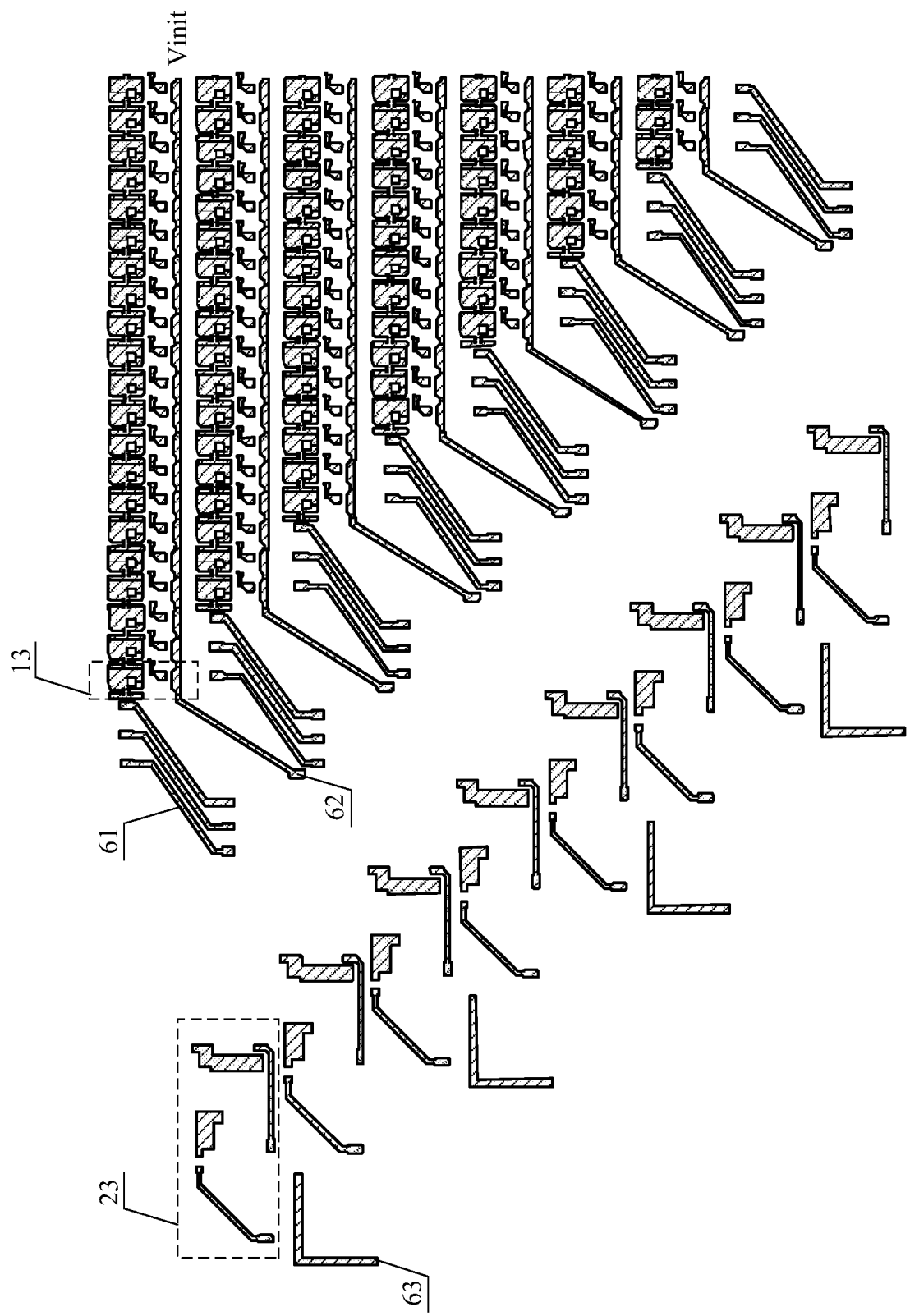
FIG. 8 is a schematic diagram of a film layer of a second metal layer of a display substrate according to an exemplary embodiment.
Figure 9:
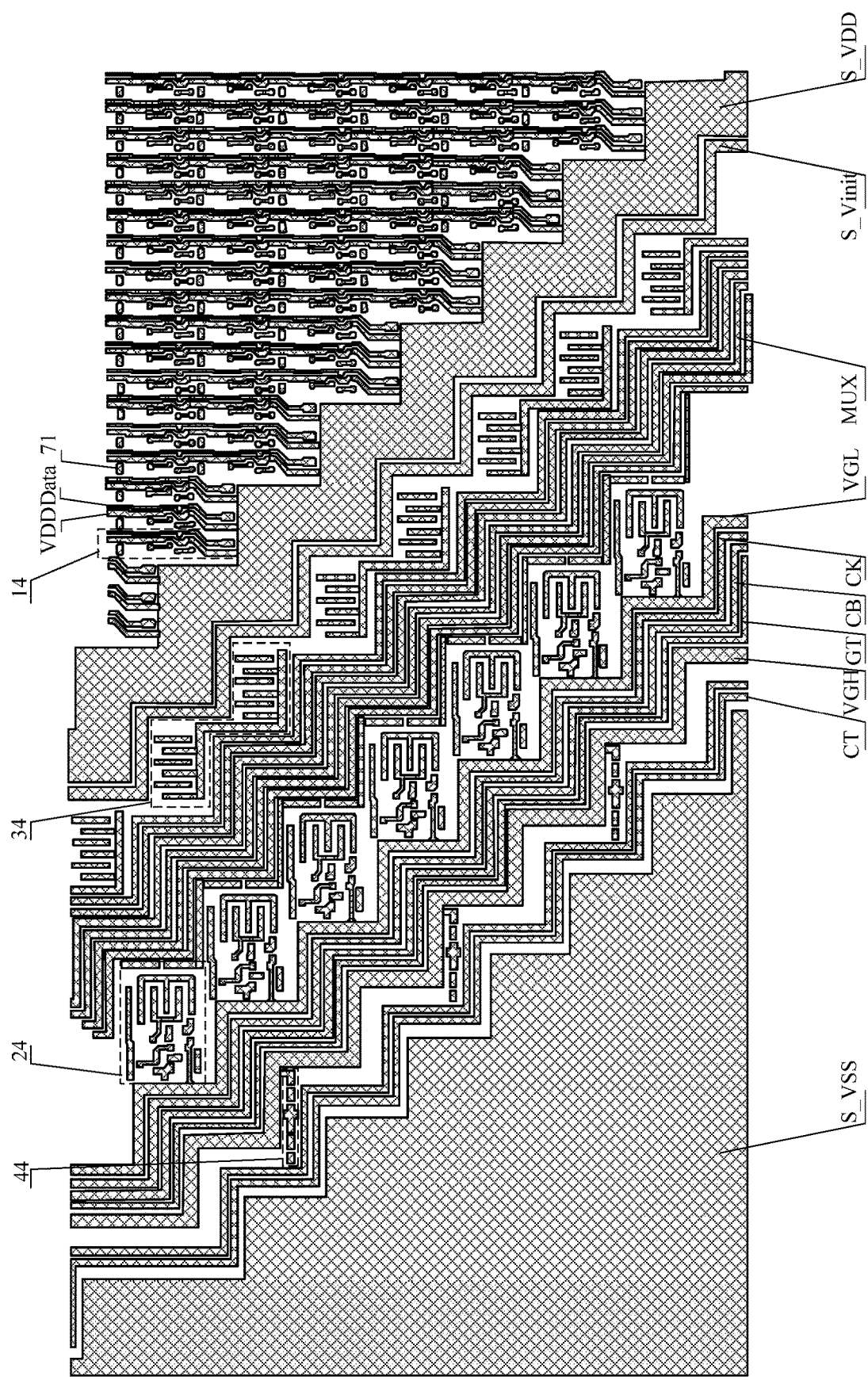
FIG. 9 is a schematic diagram of a film layer of a third metal layer of a display substrate according to an exemplary embodiment.

FIG. 6 is a schematic diagram of a film layer of an active layer of a display substrate according to an exemplary embodiment. FIG. 7 is a schematic diagram of a film layer of a first metal layer of a display substrate according to an exemplary embodiment. FIG. 8 is a schematic diagram of a film layer of a second metal layer of a display substrate according to an exemplary embodiment. FIG. 9 is a schematic diagram of a film layer of a third metal layer of a display substrate according to an exemplary embodiment. As shown in FIGS. 6 to 9, in an exemplary embodiment, a display substrate includes a base substrate and an active layer, a first insulating layer, a first metal layer, a second insulating layer, a second metal layer, a third insulating layer and a third metal layer sequentially stacked on the base substrate.

In an exemplary embodiment, the base substrate may be a rigid base substrate or a flexible base substrate, wherein the rigid base substrate may be, but is not limited to, one or more of glass and metal foil, the flexible base substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, as shown in FIG. 6, the active layer include an active layer 11 of a pixel circuit, an active layer 21 of a drive circuit, an active layer 31 of a multiplexing circuit, an active layer 41 of an electrostatic discharge circuit, an active layer of a test circuit (not shown in the figure), and an active layer of a control circuit (not shown in the figure). Among the active layer 11 of the pixel circuit includes active layers of multiple pixel transistors. The active layer of the drive circuit includes active layers of multiple shift transistors. The active layer of the multiplexing circuit includes active layers of multiple multiplexing transistors. The active layer of the electrostatic discharge circuit includes active layers of multiple discharge transistors. The active layer of the test circuit includes active layers of multiple test transistors. The active layer of the drive circuit includes active layers of multiple control transistors.

As shown in FIGS. 4 and 7, a first metal layer included a first metal layer 12 of a pixel circuit, a first metal layer 22 of a drive circuit, a first metal layer 32 of a multiplexing circuit, an first metal layer 42 of an electrostatic discharge circuit, a first metal layer of a test circuit (not shown in the figure), a first metal layer of a control circuit (not shown in the figure), a multiplexing data line 53, a light emission control line EM, a gate line Gate and a reset signal line Reset and an encapsulation electrode 50. Among them, the first metal layer of the pixel circuit includes control electrodes of multiple pixel transistors and a first plate of a pixel storage capacitor. The first metal layer of the drive circuit includes control electrodes of multiple shift transistors, a second plate of a first shift storage capacitor and a second plate of a second shift storage capacitor. The first metal layer of the multiplexing circuit includes control electrodes of multiple multiplexing transistors. The first metal layer of the electrostatic discharge circuit includes control electrodes of multiple discharge transistors.

As shown in FIG. 7, in an exemplary embodiment, the first metal layer located in the non-display region further includes a gate line connection electrode 51 and a reset connection electrode 52.

In an exemplary embodiment, the gate line connection electrode 51 is electrically connected to the gate line Gate and the signal output line, respectively, and the reset connection electrode 52 is electrically connected to the reset signal line Reset and the signal input line, respectively.

As shown in FIG. 8, in an exemplary embodiment, the second metal layer includes a second metal layer 13 of the pixel circuit, a second metal layer 23 of the drive circuit, and an initial signal line Vinit. Among them, the second metal layer of the pixel circuit includes a second plate of a pixel storage capacitor and a power connection line. The second metal layer of the drive circuit includes a first connection electrode, a second connection electrode, a first plate of a first shift storage capacitor and a first plate of a second shift storage capacitor.

As shown in FIG. 8, in an exemplary embodiment, the second metal layer located in the non-display region further includes a multiplexing connection electrode 61 and an initial connection electrode 62.

In an exemplary embodiment, the multiplexing connection electrode 61 is electrically connected to the multiplexing circuit and the data line respectively, and the initial connection electrode 62 is electrically connected to the initial signal line Vinit and the initial signal supply line respectively.

In an exemplary embodiment, the third insulating layer is provided with via holes exposing the multiplexing connection electrode and via holes exposing the initial connection electrode, the second insulating layer and the third insulating layer are provided with via holes exposing the gate line connection electrode and via holes exposing the reset connection electrode.

The data line is electrically connected to the multiplexing connection electrode through the via holes exposing the multiplexing connection electrode, and the initial signal supply line is electrically connected to the initial signal line through the via holes exposing the initial connection electrode;

The signal output line is electrically connected to the gate line connection electrode through the via hole exposing the gate line connection electrode, and the signal input line is electrically connected to the reset connection electrode through the via holes exposing the reset connection electrode.

As shown in FIG. 9, the third metal layer includes a third metal layer 14 of the pixel circuit, a third metal layer 24 of the drive circuit, a third metal layer 34 of the multiplexing circuit, a third metal layer 44 of the electrostatic discharge circuit, a third metal layer of the test circuit (not shown in the figure), a third metal layer of the control circuit (not shown in the figure), a connection electrode 71, a data line Data, a first power line VDD, a first power supply line S_VDD, an initial signal supply line S_Vinit, a multiplexing control line MUX, a third power line VGH, a fourth power line VGL, a first clock signal line CK, a second clock signal line CB, a first clock signal line CK', a second clock signal line CB', a test control line CT and a second power supply line S_VSS. The third metal layer of the pixel circuit includes first electrodes and second electrodes of multiple pixel transistors. The third metal layer of the drive circuit includes first electrodes and second electrodes of multiple shift transistors. The third metal layer of the multiplexing circuit includes first electrodes and second electrodes of multiple shift transistors. The third metal layer of the electrostatic discharge circuit includes first electrodes and second electrodes of multiple discharge transistors. The third metal layer of the test circuit includes first electrodes and second electrodes of multiple test transistors. The third metal layer of the control circuit includes first electrodes and second electrodes of multiple control transistors.

In an exemplary embodiment, as shown in FIG. 4, an orthographic projection of the second power supply line S_VSS on the base substrate at least partially overlaps with an orthographic projection of the encapsulation electrode 50 on the base substrate.

In an exemplary embodiment, the second insulating layer and the third insulating layer are provided with via holes V11 exposing the encapsulation electrode, the second power supply line is electrically connected to the encapsulation electrode through the via holes exposing the encapsulation electrode.

In an exemplary embodiment, the second insulating layer and the third insulating layer are provided with multiple via hole arrays V10. An orthographic projection of the via holes provided on the encapsulation electrode on the base substrate covers an orthographic projection of the via hole arrays on the base substrate.

In an exemplary embodiment, multiple sub-pixels disposed along a second direction are called a row of sub-pixels, and a length of each row of sub-pixels along a first direction is 74 microns to 75 microns.

In an exemplary embodiment, a length along the first direction of each step in the signal lines in a stepped shape that is near an arc-shaped display boundary is an integer multiple of the length of each row of the sub-pixels along the first direction. Here, the signal lines include a first power supply line, an initial signal supply line, a multiplexing control line, a third power line, a fourth power line, a first clock signal line, a second clock signal line, a test control line and a second power supply line.

In an exemplary embodiment, the first metal layer, the second metal layer and the third metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), which may be in a single-layer structure or a multi-layer composite structure, such as Mo/Cu/Mo.

In an exemplary embodiment, the first insulating layer, the second insulating layer and the third insulating layer may be made of any one or more of silicon oxide (SiOx), silicon nitride (SiNx) and silicon oxynitride (SiON), and may be a single layer, multiple layers or a composite layer. The first insulating layer is called a first gate insulating layer, the second insulating layer is called a second gate insulating layer, and the third insulating layer is called an interlayer insulating layer.

FIG. 6, and FIGS. 10 to 14 are schematic diagrams of a preparation process of a display substrate according to an exemplary embodiment, illustrating a layout structure in a region A1 of the display substrate. A display substrate according to an exemplary embodiment is described below with reference to FIG. 6 and FIG. 10 to FIG. 14.

Figure 10A:
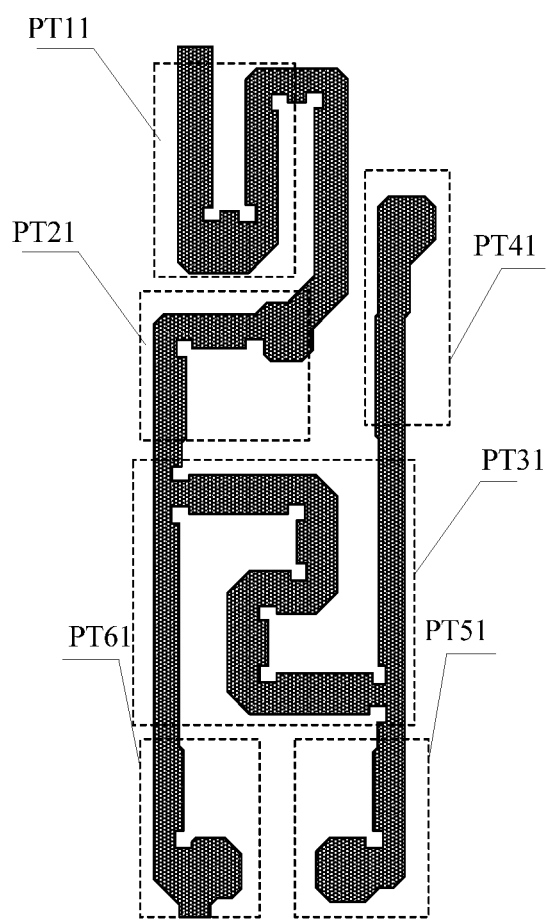
FIG. 10A is a schematic diagram of a pixel circuit after an active layer is formed.
Figure 10B:
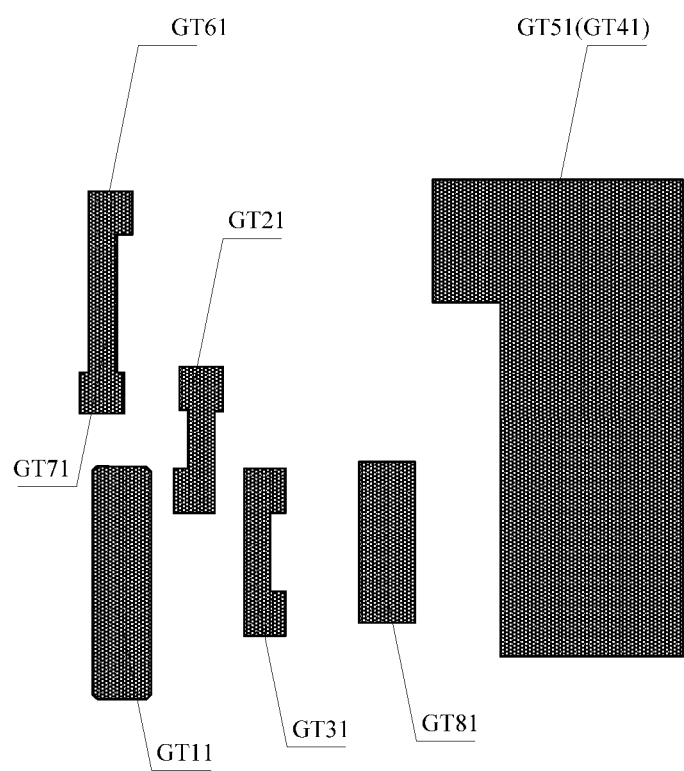
FIG. 10B is a schematic diagram of a drive circuit after the active layer is formed.

(1) forming an active layer on a base substrate, including: depositing a semiconductor thin film on the base substrate; and patterning the semiconductor thin film by a patterning process to form an active layer. The active layers include an active layer 11 of a pixel circuit, an active layer 21 of a drive circuit, an active layer 31 of a multiplexing circuit, an active layer 41 of an electrostatic discharge circuit, an active layer of a test circuit (not shown in the figures) and an active layer of a control circuit (not shown in the figures). Among them, the active layer of the pixel circuit includes an active layer PT11 of a first pixel transistor to an active layer PT61 of a sixth pixel transistor PT61. The active layer 21 of the drive circuit includes an active layer GT11 of a first shift transistor to an active layer GT81 of an eighth shift transistor, as shown in FIG. 6, FIG. 10A and FIG. 10B, FIG. 10A is a schematic diagram of a pixel circuit after an active layer is formed, and FIG. 10B is a schematic diagram of a drive circuit after an active layer is formed.

Figure 11A:
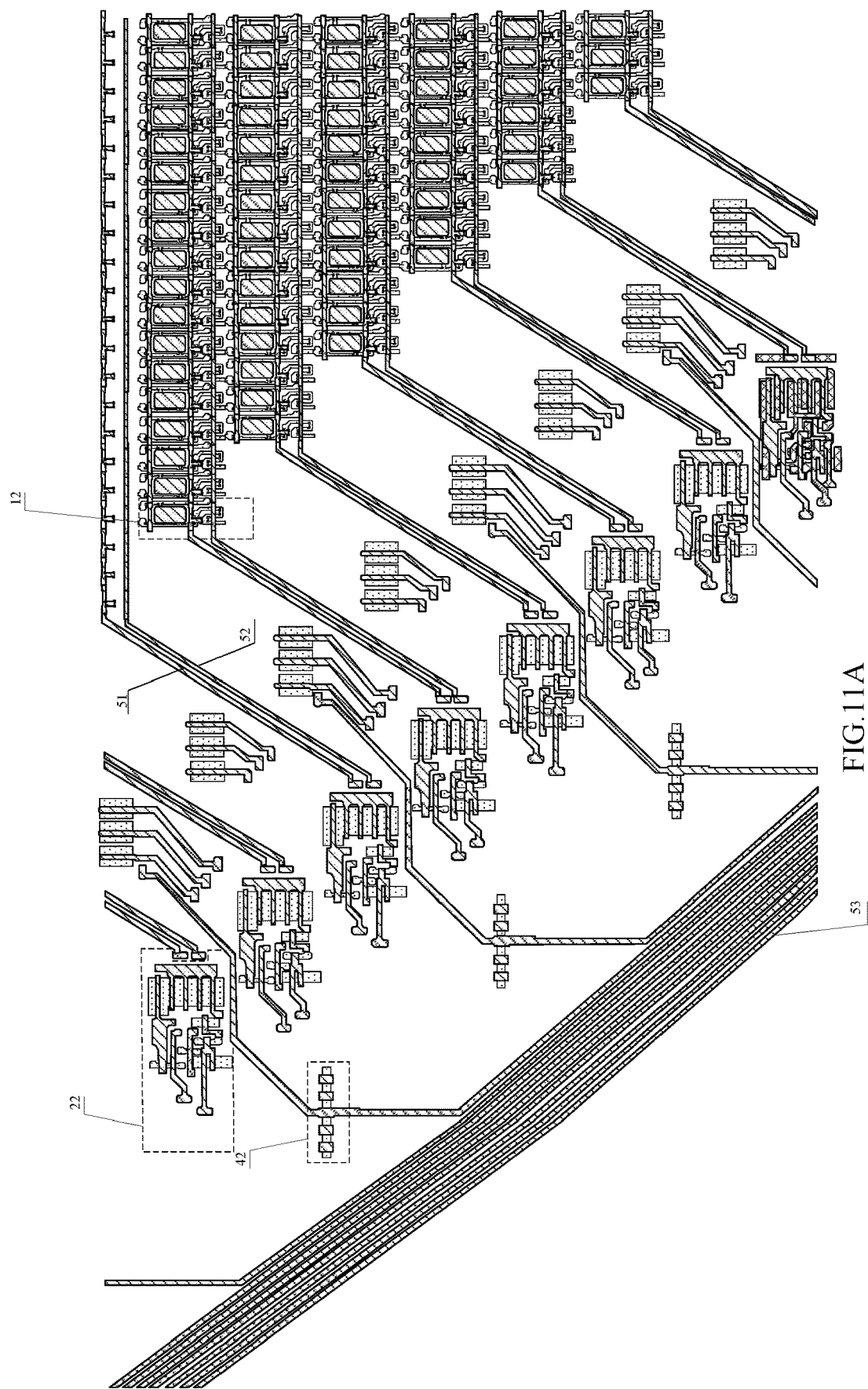
FIG. 11A is a schematic diagram after a first metal layer is formed.
Figure 11B:
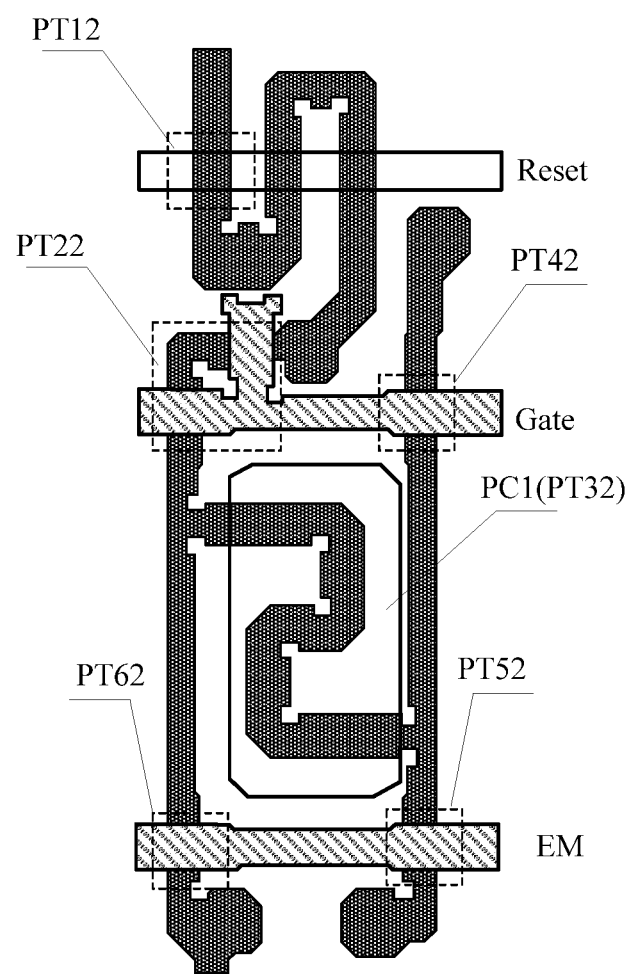
FIG. 11B is an enlarged schematic diagram of a pixel circuit after the first metal layer is formed.
Figure 11C:
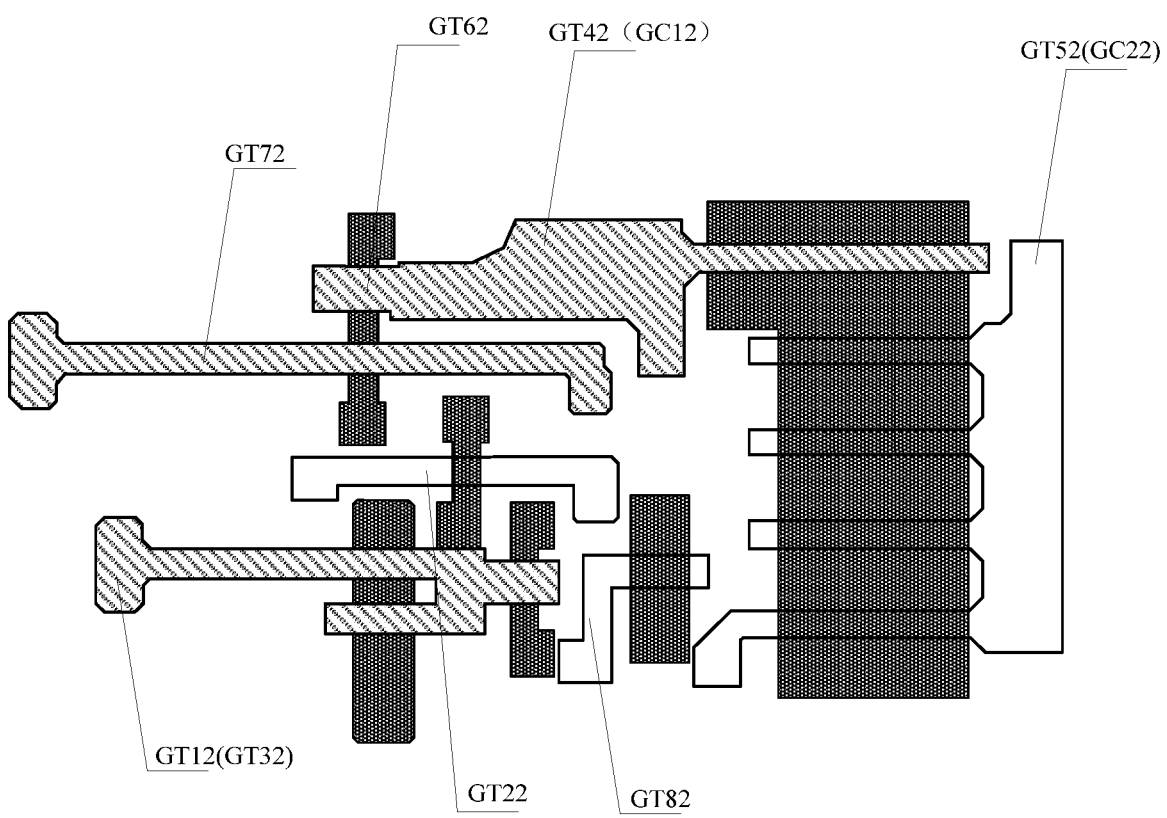
FIG. 11C is an enlarged schematic diagram of a drive circuit after the first metal layer is formed.

(2) forming a first metal layer, including: depositing a first insulating thin film on the base substrate where the active layer is formed; and patterning the first insulating thin film by a patterning process to form a first insulating layer, and depositing a first metal thin film on the first insulating layer, and patterning the first metal thin film by a patterning process to form a first metal layer. The first metal layer includes a first metal layer 12 of the pixel circuit, a first metal layer 22 of the drive circuit, a first metal layer 32 of the multiplexing circuit, a first metal layer 42 of the electrostatic discharge circuit, a first metal layer of the test circuit (not shown in the figures), a first metal layer of the control circuit (not shown in the figures), a multiplexing data line 53, a light emission control line EM, a gate line Gate, a reset signal line Reset, an encapsulation electrode 50, a gate line connection electrode 51 and a reset connection electrode 52. Among them, the first metal layer of the pixel circuit includes a control electrode PT12 of the first pixel transistor to a control electrode PT62 of the sixth pixel transistor and a first plate PC1 of a pixel storage capacitor. The first metal layer of the drive circuit includes a control electrode GT12 of the first shift transistor to a control electrode GT82 of the eighth shift transistor, a second plate GC12 of a first shift storage capacitor and a second plate GC22 of a second shift storage capacitor. The first metal layer of the multiplexing circuit includes control electrodes of multiple multiplexing transistors. The first metal layer of the electrostatic discharge circuit includes control electrodes of multiple discharge transistors, as shown in FIGS. 11A, 11B and 11C, FIG. 11A is a schematic diagram after the first metal layer is formed, FIG. 11B is an enlarged schematic diagram of the pixel circuit after the first metal layer is formed, and FIG. 11C is an enlarged schematic diagram of the drive circuit after the first metal layer is formed.

In an exemplary embodiment, the control electrode PT12 of the first pixel transistor is integrally formed with the reset signal line Reset, the control electrode PT22 of the second pixel transistor and the control electrode PT42 of the fourth pixel transistor are integrally formed with the gate line Gate, the control electrode PT32 of the third pixel transistor is integrally formed with the first plate PC1 of the pixel storage capacitor PC, and the control electrode PT52 of the fifth pixel and the control electrode PT62 of the sixth pixel transistor are integrally formed with the light emission control line EM.

In an exemplary embodiment, the control electrode GT12 of the first shift transistor is integrally formed with the control electrode GT32 of the third shift transistor, the control electrode GT42 of the fourth shift transistor is integrally formed with the second plate GC12 of the first shift storage capacitor, and the control electrode GT52 of the fifth shift transistor is integrally formed with the second plate GC22 of the second shift storage capacitor.

In an exemplary embodiment, the gate line connection electrode 51 is electrically connected to the gate line Gate, and the reset connection electrode 52 is electrically connected to the reset signal line Reset.

Figure 12A:
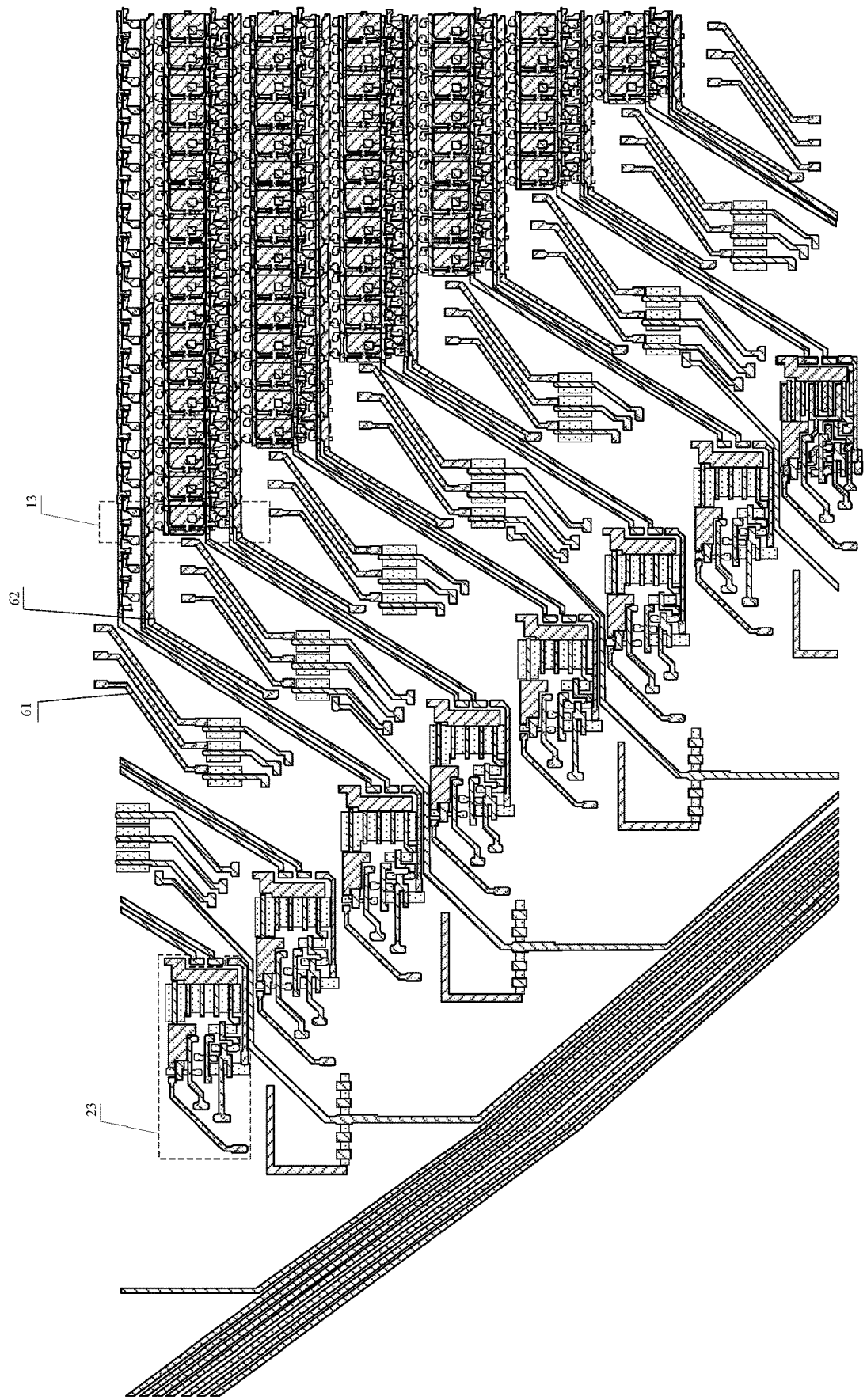
FIG. 12A is a schematic diagram after a second metal layer is formed.
Figure 12B:
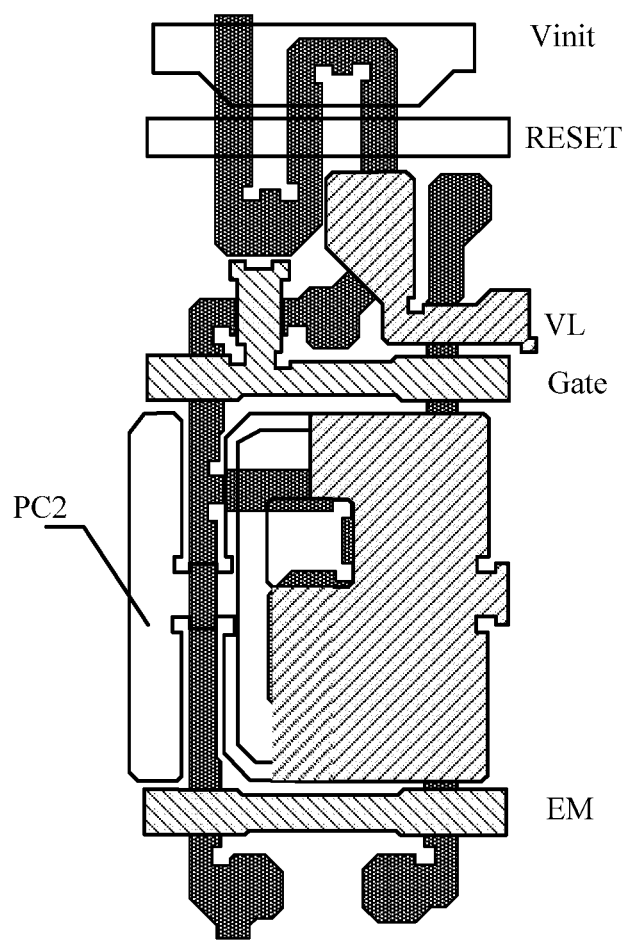
FIG. 12B is an enlarged schematic diagram of a pixel circuit after the second metal layer is formed.
Figure 12C:
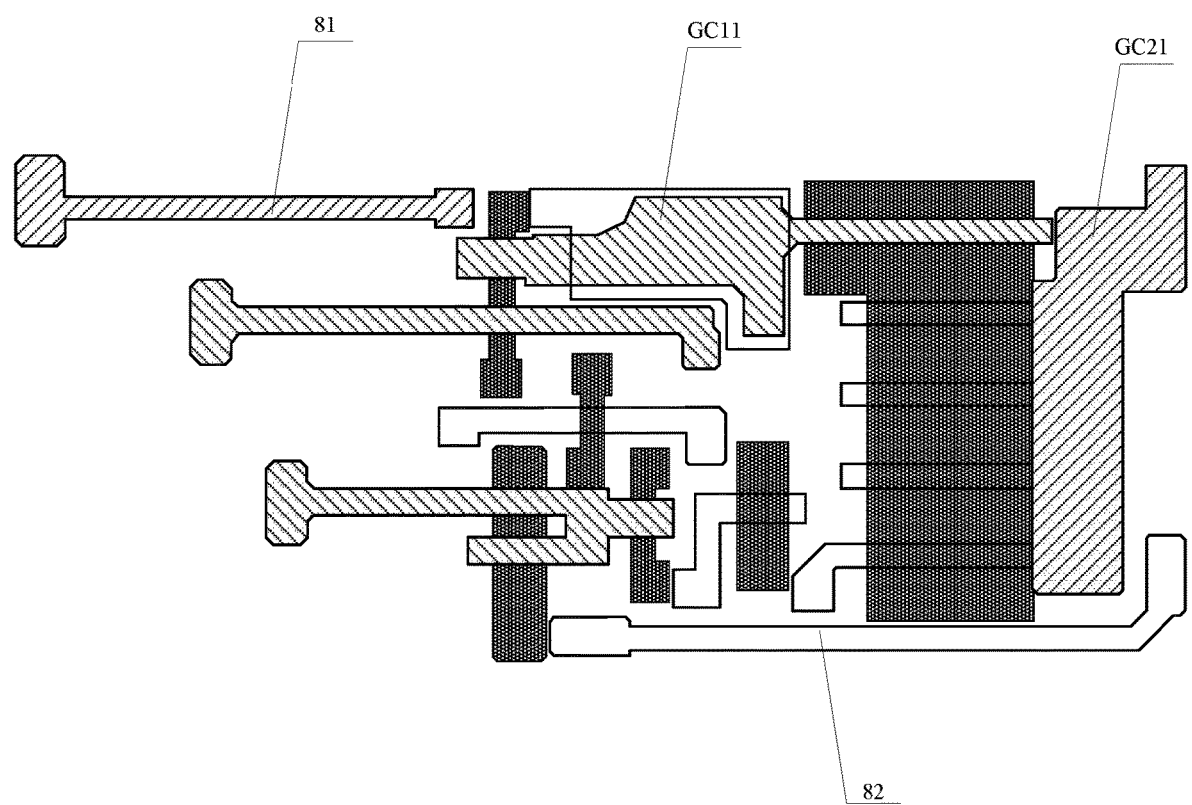
FIG. 12C is an enlarged schematic diagram of a drive circuit after the second metal layer is formed.

(3) forming a second insulating layer, including: depositing a second insulating thin film on the base substrate where the first metal layer is formed, and patterning the second insulating thin film through a patterning process to form a second insulating layer, and depositing a second metal thin film on the base substrate where the second insulating layer is formed, and patterning the second metal thin film through a patterning process to form a second metal layer. The second metal layer includes a second metal layer 13 of the pixel circuit, a second metal layer 23 of the drive circuit, an initial signal line Vinit, a multiplexing connection electrode 61 and an initial connection electrode 62. Among them, the second metal layer of the pixel circuit includes a second plate PC2 of the pixel storage capacitor and a power connection line VL. The second metal layer of the drive circuit includes a first connection electrode 81, a second connection electrode 82, a first plate GC11 of the first shift storage capacitor and a first plate GC21 of the second shift storage capacitor, as shown in FIGS. 12A, 12B and 12C, in which FIG. 12A is a schematic diagram after the second metal layer is formed, FIG. 12B is an enlarged schematic diagram of the pixel circuit after the second metal layer is formed, and FIG. 12C is an enlarged schematic diagram of the drive circuit after the second metal layer is formed.

In an exemplary embodiment, the initial connection electrode 62 is electrically connected to the initial signal line Vinit. The multiplexing connection electrode 61 is configured to be connected to a data line.

Figure 13A:
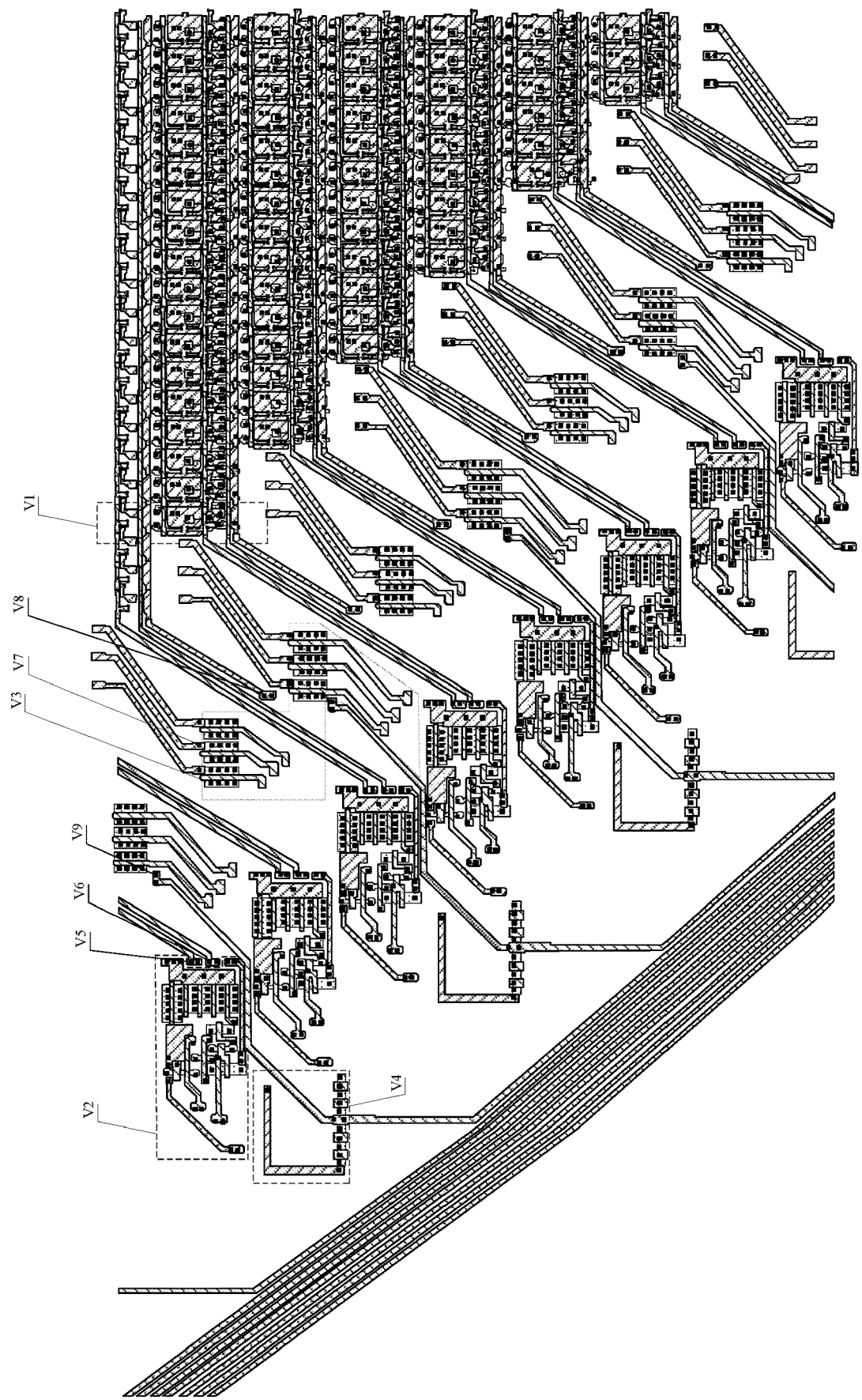
FIG. 13A is a schematic diagram after a third insulating layer is formed.
Figure 13B:
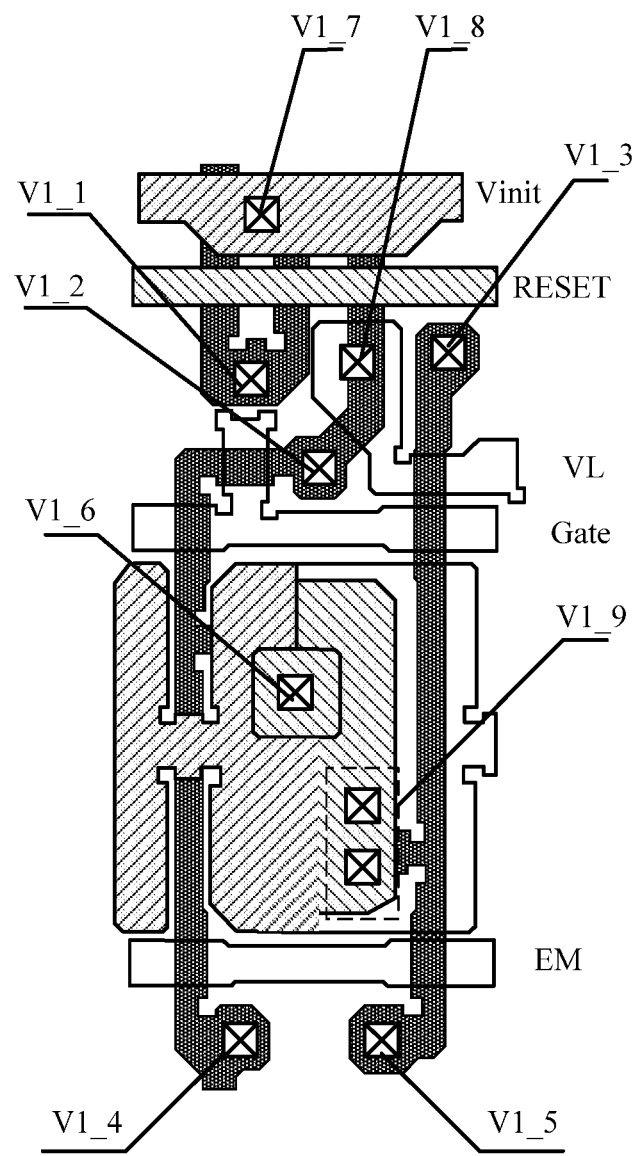
FIG. 13B is an enlarged schematic diagram of a pixel circuit after the third insulating layer is formed.
Figure 13C:
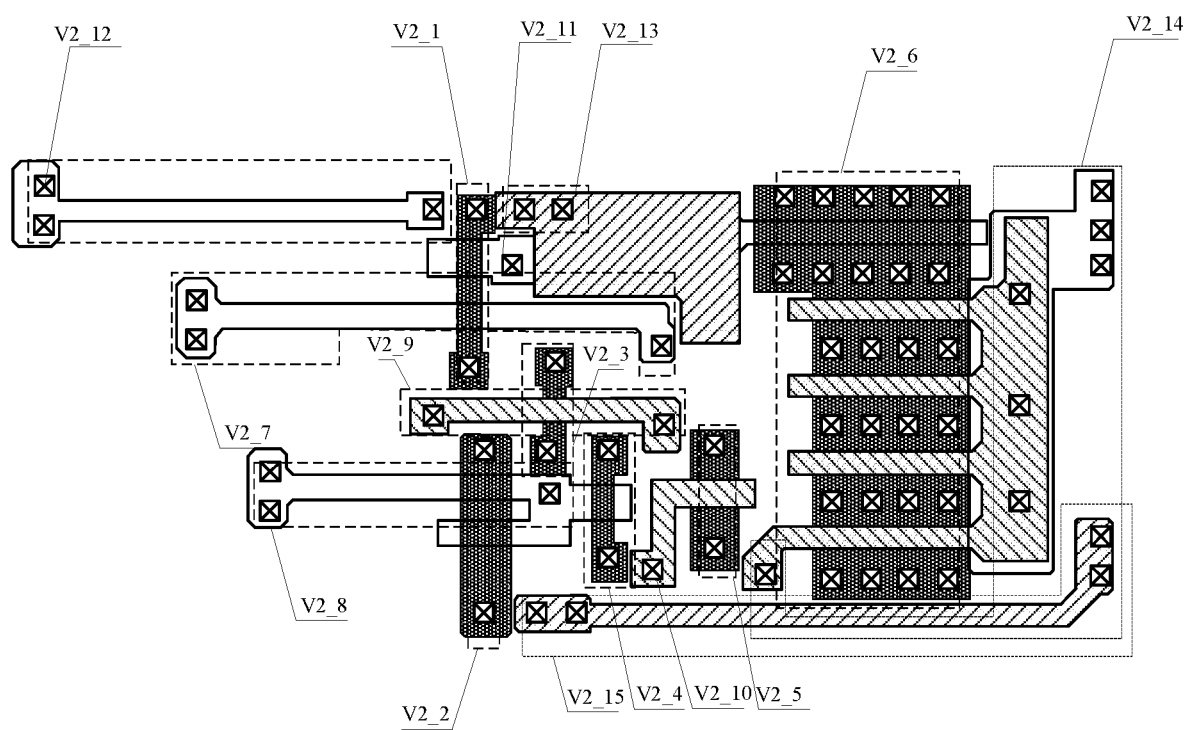
FIG. 13C is an enlarged schematic diagram of a drive circuit after the third insulating layer is formed.

(4) forming a third insulating layer, including: depositing a third insulating thin film on the base substrate where the second metal layer is formed, and patterning the third insulating thin film through a patterning process to form a third insulating layer. The formed third insulate layer is provided with multiple via holes. The multiple via holes include a first via hole V1 in the pixel circuit, a second via hole V2 in the drive circuit, a third via hole V3 in the multiplexing circuit, a fourth via hole V4 in the electrostatic discharge circuit, a fifth via hole V5 exposing the gate line connection electrode, a sixth via hole V6 exposing the reset connection circuit, a via hole V7 exposing the multiplexing connection electrode, a via hole V8 exposing the initial connection electrode and a via hole V9 exposing the multiplexing data line, as shown in FIGS. 13A, 13B and 13C. FIG. 13A is a schematic diagram after the third insulating layer is formed, FIG. 13B is an enlarged schematic diagram of the pixel circuit after the third insulating layer is formed, and FIG. 13C is an enlarged schematic diagram of the drive circuit after the third insulating layer is formed.

In an exemplary embodiment, as shown in FIG. 13B, the first via hole V1 in the pixel circuit includes first to a fifth sub-via holes V1_1 to V1_5 disposed on the first, second and third insulating layers, a sixth sub-via hole V1_6 disposed on the second and third insulating layers, and seventh to ninth sub-via holes V1_7 to V1_9 disposed on the third insulating layer. Among them, the first sub-via hole V1_1 exposes the active layer PT11 of the first pixel transistor, the second sub-via hole V1_2 exposes the active layer PT21 of the second pixel transistor, the third sub-via hole V1_3 exposes the active layer PT41 of the fourth pixel transistor, the fourth sub-via hole V1_4 exposes the active layer PT61 of the sixth pixel transistor, the fifth sub-via hole V1_5 exposes the active layer PT51 of the fifth pixel transistor, the sixth sub-via hole V1_6 exposes the first plate PC1 of the pixel storage capacitor PC, the seventh sub-via hole V1_7 exposes the initial signal line Vinit, the eighth sub-via hole V1_8 exposes the power connection line VL, and the ninth sub-via hole V1_9 exposes the second plate PC2 of the pixel storage capacitor PC.

In an exemplary embodiment, as shown in FIG. 13C, the second via hole includes first to sixth sub-via holes V2_1 to V2_6 disposed on the first, second and third insulating layers, seventh to tenth sub-via holes V2_7 to V2_10 disposed on the second insulating layer and the third insulating layer and eleventh to fifteenth sub-via holes V2_11 to V2_15 disposed on the third insulating layer. Among them, the first sub-via hole V2_1 exposes the active layers of the fourth, sixth and seventh shift transistors. The second sub-via hole V2_2 exposes the active layer of the first shift transistor. The third sub-via hole V2_3 exposes the active layer of the second shift transistor. The fourth sub-via hole V2_4 exposes the active layer of the third shift transistor. The fifth sub-via hole V2_5 exposes the active layer of the eighth shift transistor. The sixth sub-via hole V2_6 exposes the active layer of the fifth shift transistor. The seventh sub-via hole V2_7 exposes the control electrode of the seventh shift transistor. The eighth sub-via hole V2_8 exposes the control electrodes of the first and third shift transistors. The ninth sub-via hole V2_9 exposes the control electrode of the second shift transistor. The tenth sub-via hole V2_10 exposes the control electrode of the eighth shift transistor. The eleventh sub-via hole V2_11 exposes the second plate GC12 of the first shift storage capacitor. The twelfth sub-via hole V2_12 exposes the first connection electrode. The thirteenth sub-via hole V2_13 exposes the first plate GC11 of the first shift storage capacitor GC1. The fourteenth sub-via hole V2_14 exposes the first plate of the second shift storage capacitor GC1. The fifteenth sub-via hole V2_15 exposes the second connection electrode.

In an exemplary embodiment, the third via hole includes multiple sub-via holes which are formed on the first insulating layer, the second insulating layer and the third insulating layer and expose active layers of the multiple multiplexing transistors.

In an exemplary embodiment, the fourth via hole includes multiple sub-via holes which are formed on the first insulating layer, the second insulating layer and the third insulating layer and expose the active layers of the multiple discharge transistors.

Figure 14A:
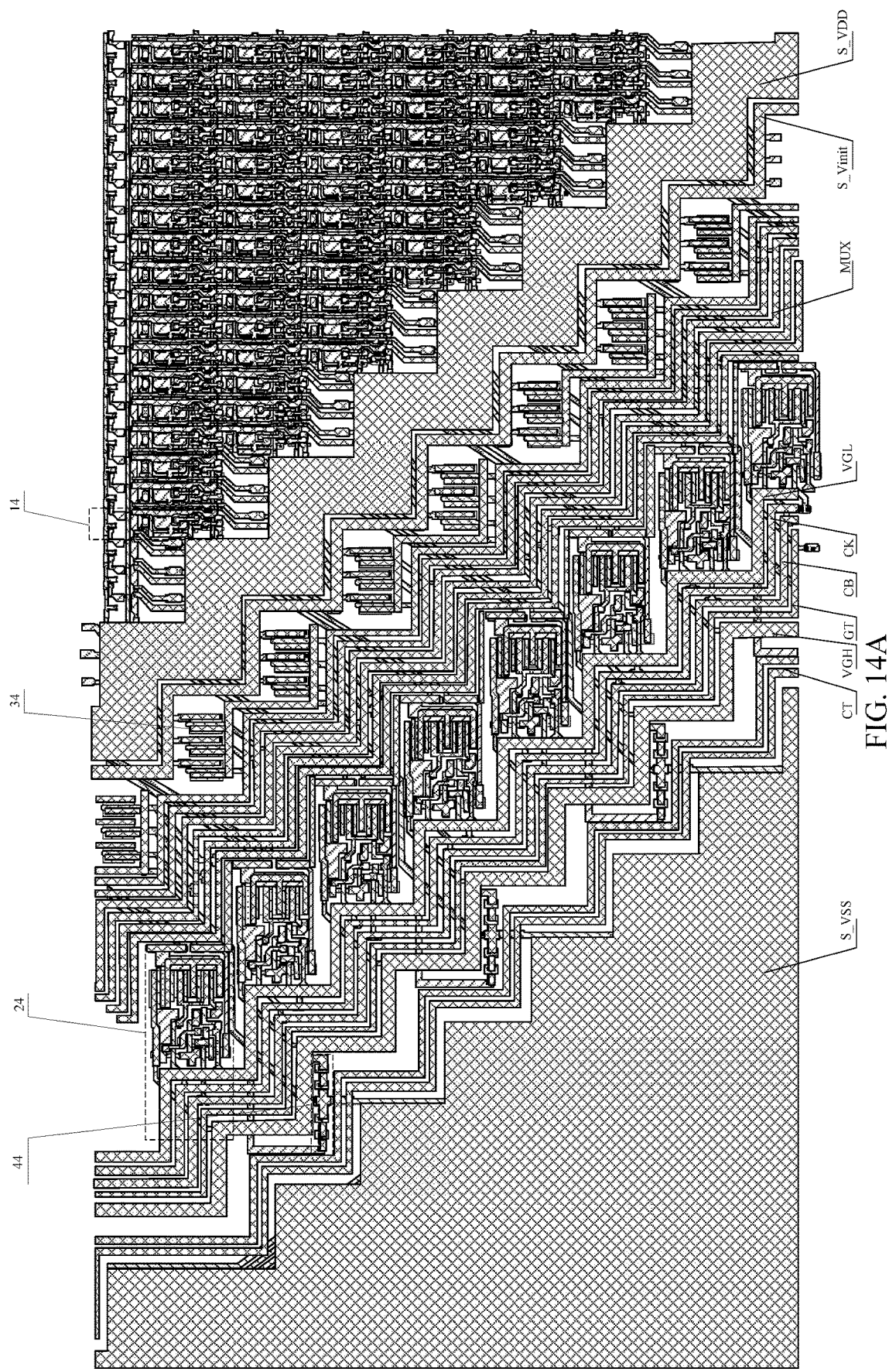
FIG. 14A is a schematic diagram after a third metal layer is formed.
Figure 14B:
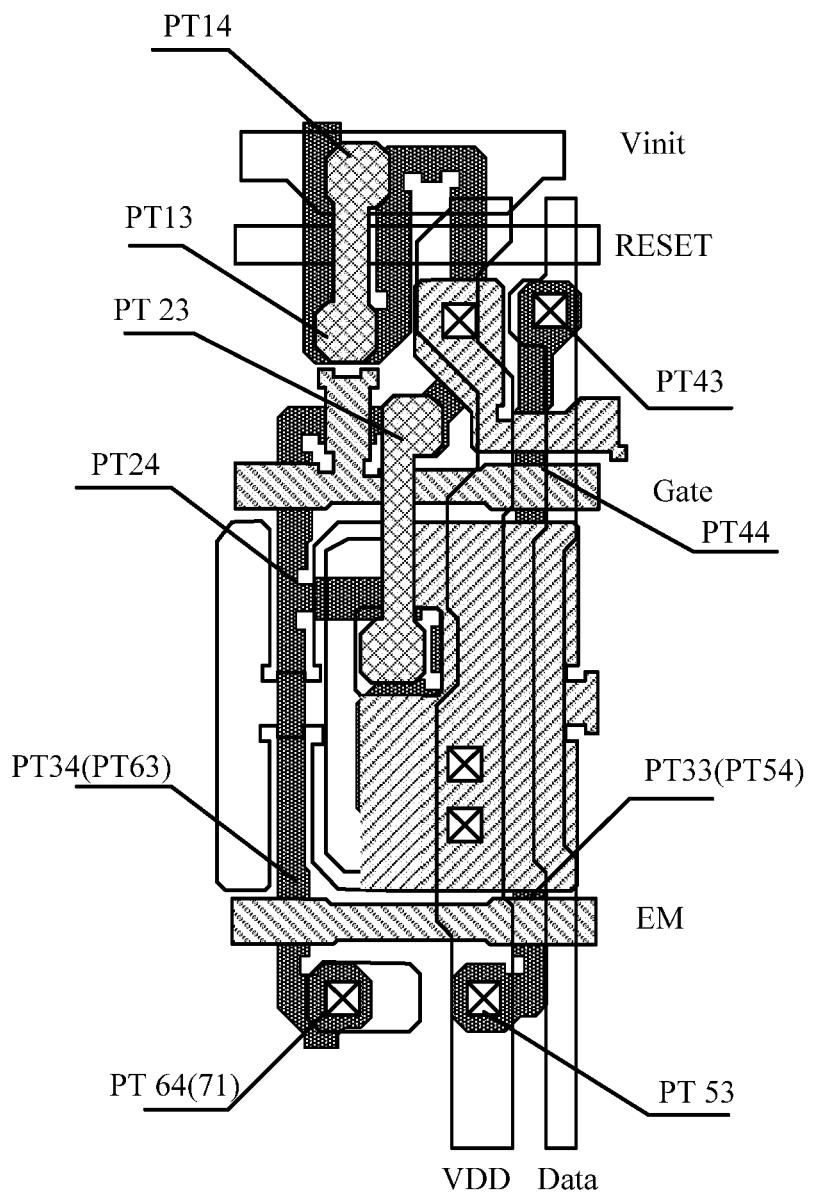
FIG. 14B is an enlarged schematic diagram of a pixel circuit after the third metal layer is formed.
Figure 14C:
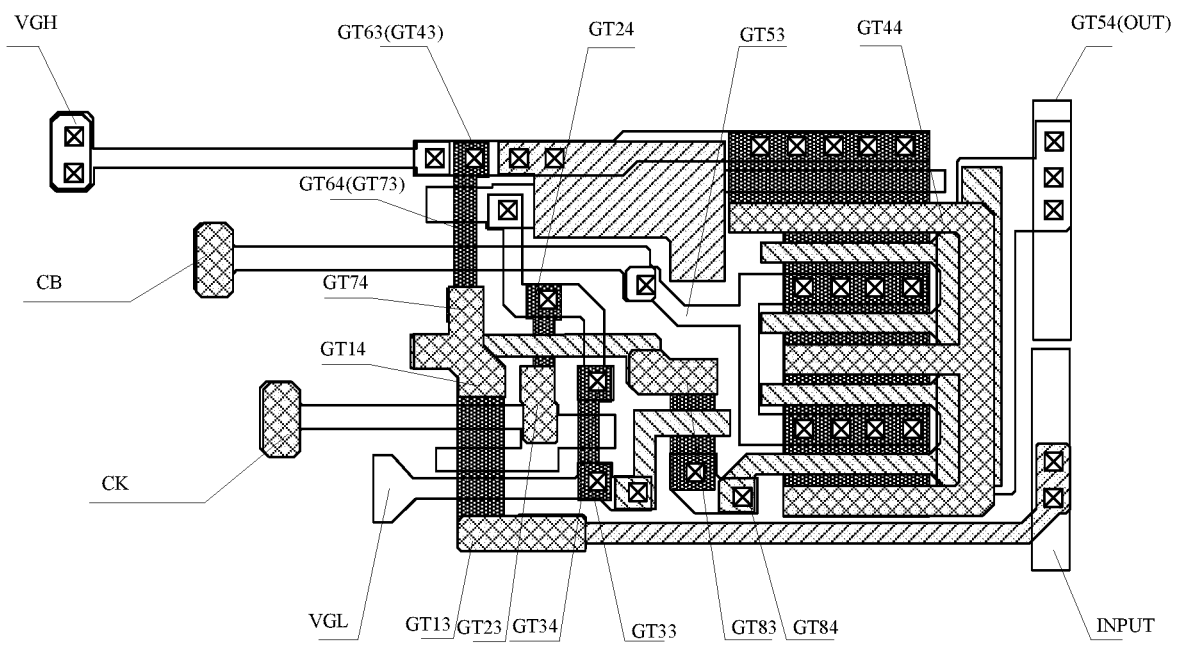
FIG. 14C is an enlarged schematic diagram of a drive circuit after the third metal layer is formed.

(5) forming a third metal layer, including: depositing a third metal thin film on the base substrate where the third insulating layer is formed, patterning the third metal thin film by a patterning process to form a third metal layer. The third metal layer includes a third metal layer 14 of the pixel circuit, a third metal layer 24 of the drive circuit, a third metal layer 34 of the multiplexing circuit, a third metal layer 44 of the electrostatic discharge circuit, a third metal layer of the test circuit (not shown in the figures), a third metal layer of the control circuit(not shown in the figures), a power supply connection line VL, a connection electrode 71, a data line Data, a first power line VDD, a first power supply line S_VDD, an initial signal supply line S_Vinit, a multiplexing control line MUX, a third power line VGH, a fourth power line VGL, a first clock signal line CK, a second clock signal line CB, a first clock signal line CK', a second clock signal line CB', a test control line CT and a second power supply line S_VSS. Among them, the third metal layer of the pixel circuit includes a first electrode PT13 and a second electrode PT14 of the first pixel transistor to a first electrode PT63 and a second electrode PT64 of the sixth pixel transistor. The third metal layer of the drive circuit includes a first electrode GT13 and a second electrode GT14 of the first shift transistor to a first electrode GT83 and a second electrode GT84 of the eighth shift transistor. The third metal layer of the multiplexing circuit includes first electrodes and second electrodes of the multiple shift transistors. The third metal layer of the electrostatic discharge circuit includes first electrodes and second electrodes of the multiple discharge transistors. The third metal layer of the test circuit includes first electrodes and second electrodes of the multiple test transistors. The third metal layer of the control circuit includes first electrodes and second electrodes of the multiple control transistors, as shown in FIGS. 14A, 14B and 14C. FIG. 14A is a schematic diagram after the third metal layer is formed, FIG. 14B is an enlarged schematic diagram of the pixel circuit after the third metal layer is formed, and FIG. 14C is an enlarged schematic diagram of the drive circuit after the third metal layer is formed.

In an exemplary embodiment, as shown in FIG. 14B, the first electrode PT13 of the first pixel transistor is electrically connected to the active layer of the first pixel transistor PT1 through the first sub-via hole, and the second electrode PT14 of the first pixel transistor is electrically connected to the initial signal line Vinit through the seventh sub-via hole. The first electrode PT23 of the second pixel transistor is electrically connected to the active layer of the second pixel transistor through the second sub-via hole, and the first electrode PT23 of the second pixel transistor electrically connected to the first plate PC1 of the pixel storage capacitor PC through the sixth sub-via hole. The first electrode PT43 of the fourth pixel transistor is electrically connected to the active layer of the fourth pixel transistor through the third sub-via hole, the first electrode PT53 of the fifth pixel transistor is electrically connected to the active layer of the fifth pixel transistor through the fifth sub-via hole, and the second electrode PT64 of the sixth pixel transistor is electrically connected to the active layer of the sixth pixel transistor through the sixth sub-via hole.

In an exemplary embodiment, as shown in FIG. 14B, the first power line VDD is integrally formed with the first electrode PT53 of the fifth pixel transistor, and the connection electrode 71 is integrally formed with the second electrode PT64 of the sixth pixel transistor.

In an exemplary embodiment, as shown in FIG. 14B, the first power line VDD is electrically connected to the power connection line VL through the eighth sub-via hole, and the first power line VDD is electrically connected to the second plate PC2 of the pixel storage capacitor PC through the ninth sub-via hole.

In an exemplary embodiment, as shown in FIG. 14B, part of the active layer is multiplexed as a same electrode as the second electrode PT24 of the second pixel transistor, the second electrode PT34 of the third pixel transistor and the first electrode PT63 of the sixth pixel transistor, and part of the active layer is multiplexed as the second electrode PT24 of the second pixel transistor.

In an exemplary embodiment, as shown in FIG. 14B, part of the active layer is multiplexed as a same electrode as the first electrode PT33 of the third pixel transistor, the second electrode PT44 of the fourth pixel transistor and the second electrode PT54 of the fifth pixel transistor, and part of the active layer is multiplexed as the first electrode PT33 of the third pixel transistor.

In an exemplary embodiment, as shown in FIG. 14C, the first electrode GT13 and the second electrode GT14 of the first shift transistor are electrically connected to the active layer of the first shift transistor through the second sub-via hole, and the first electrode GT13 of the first shift transistor is electrically connected to the second connection electrode through the fifteenth sub-via hole, and the second electrode GT14 of the first shift transistor is electrically connected to the first connection electrode 81 through the seventh sub-via hole. The first electrode GT23 and the second electrode GT24 of the second shift transistor are electrically connected to the active layer of the second shift transistor through the third sub-via hole, the first electrode GT23 of the second shift transistor is electrically connected to the control electrode of the first shift transistor through the eighth sub-via hole and the second electrode GT24 of the second shift transistor is electrically connected to the control electrode of the first shift transistor through the eighth sub-via hole. The first electrode GT33 and the second electrode GT34 of the third shift transistor are electrically connected to the active layer of the third shift transistor through the fourth sub-via hole, and the first electrode GT33 of the third shift transistor is electrically connected to the control electrode of the eighth shift transistor through the tenth sub-via hole. The first electrode GT43 and the second electrode GT44 of the fourth shift transistor are electrically connected to the active layer of the fourth shift transistor through the sixth via hole, the first electrode GT43 of the fourth shift transistor is electrically connected to the first plate GC11 of the first shift storage capacitor GC1 through the thirteenth via hole and the second electrode GT44 of the fourth shift transistor is electrically connected to the first plate GC21 of the second shift storage capacitor GC1 through the fourteenth via hole. The first electrode GT53 and the second electrode GT54 of the fifth shift transistor are electrically connected to the active layer of the fifth shift transistor through the sixth via hole, and the first electrode GT53 of the fifth shift transistor is electrically connected to the control electrode of the seventh shift transistor through the seventh sub-via hole. The first electrode GT63 of the sixth shift transistor is electrically connected to the active layer of the sixth shift transistor through the first sub-via hole. The second electrode GT74 of the seventh shift transistor is electrically connected to the active layer of the seventh shift transistor through the first sub-via. The first electrode GT83 and the second electrode GT84 of the eighth shift transistor are electrically connected to the active layer of the eighth shift transistor through the fifth sub-via hole, and the first electrode GT83 of the eighth shift transistor is electrically connected to the control electrode of the second shift transistor through the ninth sub-via hole. The second electrode GT84 of the eighth shift transistor is electrically connected to the second electrode of the second shift transistor through the fourteenth sub-via hole.

In an exemplary embodiment, as shown in FIG. 14C, the first clock signal line CK is electrically connected to the control electrode of the first shift transistor through the eighth sub-via hole. The second clock signal line CB is electrically connected to the control electrode of the seventh shift transistor through the seventh sub-via hole. The third power line VGH is electrically connected to the first connection electrode through the eleventh sub-via hole.

In an exemplary embodiment, as shown in FIG. 14C, the second electrode GT14 of the first shift transistor and the second electrode GT74 of the seventh shift transistor are a same electrode, the second electrode GT24 of the second shift transistor and the second electrode GT34 of the third shift transistor are a same electrode, and the first electrode GT33 of the third shift transistor is integrally formed with the fourth power line VGL, the first electrode GT43 of the fourth shift transistor and the first electrode GT63 of the sixth shift transistor are a same electrode, part of the active layer is multiplexed as the first electrode GT63 of the sixth shift transistor and the first electrode GT73 of the seventh shift transistor, and the first electrode GT63 of the sixth shift transistor and the first electrode GT73 of the seventh shift transistor are a same electrode.

(6) forming a planarization layer, including: depositing a fourth insulating thin film on the base substrate where the third metal layer is formed, and patterning the fourth insulating thin film through a patterning process to form a fourth insulating layer, and coating a planarization thin film on the base substrate where the fourth insulating layer is formed, and forming a first planarization layer through mask, exposure and development of the planarization thin film.

(7) forming a transparent conductive layer, including: depositing a transparent conductive thin film on the base substrate where the planarization layer is formed, and patterning the transparent conductive thin film by a patterning process to form a transparent conductive layer. The transparent conductive layer includes a first electrode formed in each light emitting element, and the first electrode is connected to the connection electrode 71.

(8) forming a pixel define layer, including: coating a pixel define thin film on the base substrate where the transparent conductive layer is formed, and forming a pixel define layer through mask, exposure and development processes, wherein the pixel define layer is formed in each light emitting element, and an opening region exposing the first electrode is formed by the pixel define layer in each light emitting element.

(9) forming an organic light-emitting layer, including: forming an organic light-emitting layer in the opening region of the formed pixel define layer and on the pixel define layer, wherein the organic light-emitting layer is electrically connected to the first electrode.

(10) forming a second electrode, including: coating a conductive thin film on the base substrate where the organic light-emitting layer is formed, and patterning the conductive thin film through a patterning process to form a second electrode. The second electrode covers the organic light-emitting layer in each light emitting element. The second electrode is electrically connected to the organic light emitting layer.

(11) forming an encapsulation layer on the base substrate where the second electrode is formed. The encapsulation layer includes a first encapsulation layer made of an inorganic material, a second encapsulation layer made of an organic material, and a third encapsulation layer made of an inorganic material. The first encapsulation layer is disposed on the second electrode, the second encapsulation layer is disposed on the first encapsulation layer, and the third encapsulation layer is disposed on the second encapsulation layer to form a laminated structure of inorganic material/organic material/inorganic material.

In an exemplary embodiment, the planarization layer may be made of an organic material, and the transparent conductive film may be made of indium tin oxide (ITO) or indium zinc oxide (IZO).

In an exemplary embodiment, polyimide, acrylic or polyethylene terephthalate may be used as the pixel define layer.

In an exemplary embodiment, any one or more of Magnesium (Mg), Argentum (Ag), Aluminum (Al), copper (Cu) and lithium (Li), or an alloy made of any one or more of the above metals may be used as the second electrode.

In an exemplary embodiment, the active layer may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or a double layer, or a multiple layer.

An embodiment of the present disclosure further provides a display apparatus, including a display substrate.

In an exemplary embodiment, the display apparatus may be a display, a television, a mobile phone, a tablet computer, a navigator, a digital photo frame, a wearable display product, or a product or component with any display function.

The display substrate is the display substrate according to any of the preceding embodiments, and has similar implementation principles and implementation effects, which will not be described further here.

The drawings in the present disclosure only involve the structures included in the embodiments of the present disclosure, and other structures may refer to common designs.

For the sake of clarity, the thickness and size of layers or microstructures are exaggerated in the drawings used to describe the embodiments of the present disclosure. It may be understood that when an element such as a layer, film, region or substrate is referred to as being "on" or "under" another element, the element may be "directly" "on" or "under" the another element, or there may be a middleware.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What is claimed is:

1. A display substrate, comprising: a display region and a non-display region surrounding the display region, wherein the display region comprises at least one arc-shaped display boundary;

the display region comprises a plurality of sub-pixels, a plurality of data lines extending along a first direction and a plurality of gate lines extending along a second direction, each sub-pixel comprises a pixel circuit and a light emitting element connected to the pixel circuit, wherein the pixel circuit in each sub-pixel is electrically connected to a gate line and a data line respectively, and at least part of the sub-pixels near the arc-shaped display boundary are disposed in a terraced manner; and the non-display region comprises a plurality of drive circuits which are cascaded and provide drive signals to the plurality of gate lines, and at least part of the drive circuits near the arc-shaped display boundary are disposed in a terraced manner;

wherein the first direction intersects with the second direction;

wherein the display region further comprises a plurality of first power lines extending along the first direction and a plurality of initial signal lines extending along the second direction, and the pixel circuit in each sub-pixel is electrically connected to a first power line and an initial signal line respectively;

the non-display region further comprises a first power supply line and an initial signal supply line, and the first power supply line and the initial signal supply line are in an annular shape;

the first power supply line is located on a side of the plurality of drive circuits close to the display region, and is electrically connected to the first power line connected to each pixel circuit, and the first power supply line near the arc-shaped display boundary is in a terraced shape; and the initial signal supply line is located between the plurality of drive circuits and the first power supply line, and is electrically connected to the initial signal line connected to each pixel circuit, and the initial signal supply line near the arc-shaped display boundary is in a terraced shape.

2. The display substrate according to claim 1, wherein a line width of the first power supply line is greater than a line width of the initial signal supply line.

3. The display substrate according to claim 1, wherein the display region further comprises a second power line, wherein the light emitting element in each sub-pixel is electrically connected to the second power line;

the non-display region further comprises a second power supply line, wherein the second power supply line is in an annular shape;

the second power supply line is located on a side of the plurality of drive circuits away from the display region, and is electrically connected to the second power line connected to each light emitting element, a surface of the second power supply line near the arc-shaped display boundary near the display region is in a terraced shape, and a surface of the second power supply line near the arc-shaped display boundary away from the display region is arc-shaped.

4. The display substrate according to claim 3, wherein a line width of the second power supply line is greater than a line width of the first power supply line.

5. The display substrate according to claim 3, wherein the non-display region further comprises an encapsulation electrode;
the encapsulation electrode is located on a side of the second power supply line away from the display region, and the encapsulation electrode is disposed in a different layer from the second power supply line and is electrically connected to the second power supply line; and
the encapsulation electrode is provided with a plurality of via holes.

6. The display substrate according to claim 1, wherein the display region further comprises a plurality of light emission control lines and reset control lines extending along the second direction, the pixel circuit in each sub-pixel is electrically connected to a light emission control line and a reset control line;
the non-display region comprises a plurality of control circuits which are cascaded and provide control signals to the plurality of light emission control lines, and at least part of the control circuits near the arc-shaped display boundary are disposed in a terraced manner; and
the plurality of drive circuits and the plurality of control circuits are respectively located on a first side and a second side of the display region which are oppositely disposed.

7. The display substrate according to claim 1, wherein the non-display region further comprises a plurality of multiplexing circuits located between the plurality of drive circuits and an initial signal supply line, electrically connected to a plurality of data lines and configured to provide data signals to the data lines connected thereto;
wherein at least part of the multiplexing circuits near the arc-shaped display boundary are disposed in a terraced manner.

8. The display substrate according to claim 7, wherein the non-display region further comprises a plurality of multiplexing control lines and a plurality of multiplexing data lines, and each multiplexing circuit is electrically connected to the plurality of multiplexing control lines and one multiplexing data line respectively;
the plurality of multiplexing control lines are located between the plurality of drive circuits and the plurality of multiplexing circuits, the plurality of multiplexing control lines near the arc-shaped display boundary are in a terraced shape.

9. The display substrate according to claim 1, wherein the non-display region further comprises a plurality of electrostatic discharge circuits, each of the electrostatic discharge circuits is connected to one signal line and is configured to discharge static electricity in the signal line connected thereto, and the signal line comprises a multiplexing data line; and
the plurality of electrostatic discharge circuits are located between the plurality of drive circuits and a second power supply line, and at least part of the electrostatic discharge circuits near the arc-shaped display boundary are disposed in a terraced manner.

10. The display substrate according to claim 1, wherein the non-display region further comprises a test control line and a plurality of test circuits, and the test circuits are electrically connected to the test control line and the data lines respectively, and are configured to provide test signals to the data lines;
the plurality of test circuits are located on a third side of the display region, and the third side is different from a first side and a second side;
the test control line is located between a second power supply line and a plurality of electrostatic discharge circuits, and the test control line near the arc-shaped display boundary is in a terraced shape.

11. The display substrate according to claim 1, wherein the non-display region further comprises a third power line and a fourth power line, each drive circuit is electrically connected to the third power line and the fourth power line respectively, and the third power line and the fourth power line are in an annular shape;
the third power line is located between electrostatic discharge circuits and the plurality of drive circuits, and the third power line near the arc-shaped display boundary is in a terraced shape; and
the fourth power line is located between the third power line and the plurality of drive circuits, and the fourth power line near the arc-shaped display boundary is in a terraced shape.

12. The display substrate according to claim 11, wherein the non-display region further comprises a first clock signal line, a second clock signal line, a signal input line and a signal output line, and each drive circuit is electrically connected to the first clock signal line, the second clock signal line, the signal input line and the signal output line respectively;
the first clock signal line is located between the third power line and the plurality of drive circuits, and the first clock signal line near the arc-shaped display boundary is in a terraced shape;
the second clock signal line is located between the third power line and the first clock signal line, and the second clock signal line near the arc-shaped display boundary is in a terraced shape; and
the signal input line and the signal output line are located on a side of the drive circuits close to the display region.

13. The display substrate according to claim 12, wherein the non-display region further comprises a plurality of multiplexing connection electrodes and a plurality of initial connection electrodes;
the multiplexing connection electrodes are electrically connected to the multiplexing circuits and the data lines respectively,
an initial connection electrode is electrically connected to an initial signal line and an initial signal supply line respectively;
wherein the plurality of multiplexing connection electrodes and the plurality of initial connection electrodes are disposed in a same layer, the initial connection electrodes and the initial signal lines are disposed in a same layer, and the multiplexing connection electrodes are disposed in a different layer from the data lines.

14. The display substrate according to claim 13, wherein the non-display region further comprises a gate line connection electrode and a reset connection electrode;
the gate line connection electrode is electrically connected to the gate line and the signal output line respectively;
the reset connection electrode is electrically connected to the reset signal line and the signal input line respectively; and
wherein the gate line connection electrode and the reset connection electrode are disposed in a same layer and are disposed in a same layer as the gate line.

15. The display substrate according to claim 1, further comprising a multiplexing circuit, an electrostatic discharge circuit, a test circuit and a control circuit located in the non-display region, wherein the pixel circuit comprises a plurality of pixel transistors, the drive circuit comprises a plurality of shift transistors, the multiplexing circuit comprises a plurality of multiplexing transistors, the electrostatic discharge circuit comprises a plurality of discharge transistors, the test circuit comprises a plurality of test transistors, and the control circuit comprises a plurality of control transistors;

the display substrate comprises a base substrate and an active layer, a first insulating layer, a first metal layer, a second insulating layer, a second metal layer, a third insulating layer and a third metal layer which are sequentially stacked on the base substrate;

the active layer comprises active layers of a plurality of pixel transistors, active layers of a plurality of shift transistors, active layers of a plurality of multiplexing transistors, active layers of a plurality of discharge transistors, active layers of a plurality of test transistors and active layers of a plurality of control transistors;

wherein the first metal layer comprises control electrodes of the plurality of pixel transistors, control electrodes of the plurality of shift transistors, control electrodes of the plurality of multiplexing transistors, control electrodes of the plurality of test transistors, control electrodes of the plurality of discharge transistors, control electrodes of the plurality of control transistors, a multiplexing data line, a light emission control line, a gate line, a reset signal line, a gate line connection electrode, a reset connection electrode and an encapsulation electrode; the second metal layer comprises an initial signal line, a multiplexing connection electrode and an initial connection electrode; the third metal layer comprises first electrodes and second electrodes of the plurality of pixel transistors, first electrodes and second electrodes of the plurality of shift transistors, first electrodes and second electrodes of the plurality of multiplex transistors, first electrodes and second electrodes of the plurality of test transistors, first electrodes and second electrodes of the plurality of discharge transistors, first electrodes and second electrodes of the plurality of control transistors, a data line, a first power line, a first power supply line, an initial signal supply line, a multiplexing control line, a third power line, a fourth power line, a first clock signal line, a second clock signal line, a test control line, and a second power supply line.

16. The display substrate according to claim 15, wherein the third insulating layer is provided with via holes exposing the multiplexing connection electrode and via holes exposing the initial connection electrode, the second insulating layer and the third insulating layer are provided with via holes exposing the gate line connection electrode and via holes exposing the reset connection electrode;

the data line is electrically connected to the multiplexing connection electrode through the via holes exposing the multiplexing connection electrode, and the initial signal supply line is electrically connected to the initial signal line through the via holes exposing the initial connection electrode; and the signal output line is electrically connected to the gate line connection electrode through the via holes exposing the gate line connection electrode, and the signal input line is electrically connected to the reset connection electrode through the via holes exposing the reset connection electrode.

17. The display substrate according to claim 15, wherein an orthographic projection of the second power supply line on the base substrate at least partially overlaps with an orthographic projection of the encapsulation electrode on the base substrate;

the second insulating layer and the third insulating layer are provided with via holes exposing the encapsulation electrode, the second power supply line is electrically connected to the encapsulation electrode through the via holes exposing the encapsulation electrode; and the second insulating layer and the third insulating layer are provided with a plurality of via hole arrays, and an orthographic projection of the via holes disposed on the encapsulation electrode on the base substrate covers an orthographic projection of the via hole arrays on the base substrate.

18. The display substrate according to claim 1, wherein a plurality of sub-pixels disposed along the second direction are called a row of sub-pixels, and a length of each row of sub-pixels along the first direction is 74 microns to 75 microns;

a length of each step of terraced signal lines near the arc-shaped display boundary along the first direction is an integral multiple of the length of each row of sub-pixels along the first direction; and the signal lines comprise a first power supply line, an initial signal supply line, a multiplexing control line, a third power line, a fourth power line, a first clock signal line, a second clock signal line, a test control line and a second power supply line.

19. A display apparatus, comprising the display substrate according to claim 1.

* * * * *